(12) United States Patent
Kim-Whitty

(10) Patent No.: US 10,480,611 B2
(45) Date of Patent: Nov. 19, 2019

(54) METHOD FOR IMPROVED SEMICONDUCTOR PROCESSING EQUIPMENT TOOL PEDESTAL / PAD VIBRATION ISOLATION AND REDUCTION

(71) Applicant: SK COMMERCIAL CONSTRUCTION, INC., Belton, TX (US)

(72) Inventor: Suk K. Kim-Whitty, Belton, TX (US)

( * ) Notice: Subject to any disclaimer, the term of this patent is extended or adjusted under 35 U.S.C. 154(b) by 0 days.

(21) Appl. No.: 16/102,561

(22) Filed: Aug. 13, 2018

(65) Prior Publication Data

US 2019/0040929 A1 Feb. 7, 2019

Related U.S. Application Data

(63) Continuation-in-part of application No. 15/640,558, filed on Jul. 2, 2017, now Pat. No. 10,113,610, which is a continuation-in-part of application No. 15/472,154, filed on Mar. 28, 2017, now Pat. No. 9,995,365.

(51) Int. Cl.
| | |
|---|---|
| *F16F 15/04* | (2006.01) |
| *F16F 15/03* | (2006.01) |
| *E04F 15/024* | (2006.01) |
| *G03F 7/20* | (2006.01) |
| *E04C 3/36* | (2006.01) |
| *E04B 5/32* | (2006.01) |

(52) U.S. Cl.
CPC .............. *F16F 15/04* (2013.01); *E04C 3/36* (2013.01); *E04F 15/02494* (2013.01); *F16F 15/03* (2013.01); *G03F 7/709* (2013.01); *E04B 5/328* (2013.01); *E04F 15/024* (2013.01); *E04F 15/02429* (2013.01); *E04F 15/02435* (2013.01); *E04F 15/02488* (2013.01)

(58) Field of Classification Search
CPC .............. E04F 15/024; E04F 15/02429; E04F 15/02488; E04F 15/02435; E04C 3/36; E04B 5/328; F16F 15/04
USPC ....... 248/581, 618, 621, 622, 632, 633, 638; 52/126.5, 126.6, 167.7–167.9
See application file for complete search history.

(56) References Cited

U.S. PATENT DOCUMENTS

| | | | | |
|---|---|---|---|---|
| 2,116,654 A | * | 5/1938 | Barge .................... | E04B 1/8218 181/207 |
| 2,686,009 A | * | 8/1954 | Crowe .................... | E01B 9/683 106/15.05 |
| 2,776,101 A | * | 1/1957 | McDermott .............. | F16F 1/36 248/633 |
| 2,914,275 A | * | 11/1959 | Mitchell ................. | F16F 1/376 181/207 |
| 3,181,664 A | * | 5/1965 | Aagaard ............... | E04B 1/0007 52/238.1 |
| 3,606,704 A | * | 9/1971 | Denton ................. | E04F 15/024 248/619 |
| 4,209,868 A | * | 7/1980 | Tada ..................... | E01D 19/043 14/73.5 |

(Continued)

*Primary Examiner* — Eret C McNichols
(74) *Attorney, Agent, or Firm* — Hulsey, PC

(57) ABSTRACT

The present disclosure provides a method, system, and fabrication facility that eliminates or substantially reduces process-limiting vibrations within a high-precision device manufacturing facility, wherein an elevated structure supports high-precision device manufacturing equipment and provides vibration reduction spacing between a floor and an upper surface of said elevated structure.

11 Claims, 16 Drawing Sheets

(56) References Cited

U.S. PATENT DOCUMENTS

| | | | | |
|---|---|---|---|---|
| 4,258,516 A * | 3/1981 | Mori | E04F 15/02476 | 52/126.6 |
| 4,261,149 A * | 4/1981 | Gustafson | E04B 1/343 | 52/292 |
| 4,330,974 A * | 5/1982 | Fleisch | A47B 3/00 | 248/225.21 |
| 4,425,980 A * | 1/1984 | Miles | B64C 1/40 | 181/208 |
| 4,546,580 A * | 10/1985 | Ueno | E04D 11/005 | 52/126.1 |
| 4,581,863 A * | 4/1986 | Thaler | E04D 13/1407 | 248/354.3 |
| 4,593,501 A * | 6/1986 | Delfosse | E04H 9/022 | 188/378 |
| 4,766,708 A * | 8/1988 | Sing | E04B 1/98 | 248/585 |
| 4,856,626 A * | 8/1989 | Nakanishi | F16F 3/08 | 188/371 |
| 4,899,323 A * | 2/1990 | Fukahori | E04B 1/36 | 248/560 |
| 4,901,490 A * | 2/1990 | Zinniel | E04F 15/02405 | 248/346.5 |
| 5,111,627 A * | 5/1992 | Brown | E04F 15/024 | 52/126.5 |
| 5,197,707 A * | 3/1993 | Kohan | F16F 7/01 | 248/562 |
| 5,205,091 A * | 4/1993 | Brown | E04F 15/024 | 52/126.6 |
| 5,265,386 A * | 11/1993 | Muhlethaler | E04F 15/024 | 52/126.6 |
| 5,389,737 A * | 2/1995 | Kobayashi | E04F 15/02435 | 174/483 |
| 5,433,045 A * | 7/1995 | Yano | E04H 9/021 | 248/581 |
| 5,462,141 A * | 10/1995 | Taylor | E04H 9/02 | 188/280 |
| 5,572,842 A * | 11/1996 | Stief | E04F 15/02429 | 52/144 |
| 5,653,070 A * | 8/1997 | Seguin | F16F 15/02 | 248/621 |
| 5,691,806 A * | 11/1997 | Tokuda | G03B 27/58 | 355/53 |
| 5,862,638 A * | 1/1999 | Holland | E04H 9/022 | 248/562 |
| 5,884,440 A * | 3/1999 | Kubo | E04H 9/022 | 52/167.1 |
| 6,070,381 A * | 6/2000 | Blumer | E04F 15/22 | 156/71 |
| 6,208,408 B1 * | 3/2001 | Takabayashi | G03F 7/702 | 355/53 |
| 6,266,133 B1 * | 7/2001 | Miyajima | G03B 27/58 | 355/72 |
| 6,354,048 B1 * | 3/2002 | Gillett | B23Q 41/00 | 52/220.1 |
| 6,488,600 B1 * | 12/2002 | Gordon | A63B 5/11 | 473/415 |
| 6,494,012 B2 * | 12/2002 | Seng | E04B 1/24 | 52/309.14 |
| 6,494,149 B1 * | 12/2002 | De Groot | B65D 19/38 | 108/56.3 |
| 6,510,660 B1 * | 1/2003 | Michioka | E04H 9/02 | 52/1 |
| 6,536,990 B2 * | 3/2003 | Schubert | B60R 19/34 | 248/351 |
| 6,618,122 B2 * | 9/2003 | Bisschops | F16C 32/0603 | 355/53 |
| 6,648,295 B2 * | 11/2003 | Herren | F16F 15/0275 | 248/562 |
| 7,650,726 B2 * | 1/2010 | Jakob-Bamberg | E04B 5/48 | 248/188.2 |
| 7,762,026 B2 * | 7/2010 | Smelser | E04C 3/02 | 52/167.1 |
| 7,765,756 B2 * | 8/2010 | Bontrager, II | E04D 11/02 | 428/316.6 |
| 7,849,646 B2 * | 12/2010 | Harinishi | E04F 15/225 | 248/633 |
| 8,176,690 B2 * | 5/2012 | Stanley | E04B 1/14 | 52/274 |
| 8,215,245 B2 * | 7/2012 | Morrison | F16F 1/3732 | 108/91 |
| 8,231,098 B2 * | 7/2012 | Ryaboy | F16F 15/02 | 188/378 |
| 8,641,492 B2 * | 2/2014 | Meyer | H05K 7/20745 | 454/184 |
| 8,733,037 B2 * | 5/2014 | Bindschedler | E04D 11/007 | 52/173.3 |
| 8,863,471 B2 * | 10/2014 | Pfluger | E04F 15/02488 | 52/1 |
| 9,038,324 B2 * | 5/2015 | Kugler | E04F 15/02464 | 52/126.6 |
| 9,284,107 B2 * | 3/2016 | Schultz | F16F 15/067 | |
| 2003/0037997 A1 * | 2/2003 | Sakata | F16F 13/305 | 188/71.5 |
| 2004/0128939 A1 * | 7/2004 | Kim | E04B 5/12 | 52/650.3 |
| 2006/0006307 A1 * | 1/2006 | Mogilever | F16F 15/04 | 248/638 |
| 2006/0272111 A1 * | 12/2006 | Kim | E01D 19/125 | 14/73 |
| 2008/0202846 A1 * | 8/2008 | Gernhart | F16F 15/04 | 181/208 |
| 2008/0218970 A1 * | 9/2008 | Kehret | H05K 7/1434 | 361/699 |
| 2008/0222973 A1 * | 9/2008 | Lee | E04F 15/02476 | 52/126.1 |
| 2009/0094906 A1 * | 4/2009 | Sato | E04H 9/021 | 52/167.4 |
| 2010/0281789 A1 * | 11/2010 | Vac | E04F 15/02458 | 52/126.5 |
| 2014/0345210 A1 * | 11/2014 | Gentili | E04H 9/023 | 52/167.8 |
| 2016/0002468 A1 * | 1/2016 | Heikkila | B29C 64/165 | 428/35.6 |
| 2016/0146283 A1 * | 5/2016 | Sato | F16F 15/04 | 267/141.1 |
| 2016/0289961 A1 * | 10/2016 | Gill | B32B 15/08 | |
| 2016/0334718 A1 * | 11/2016 | Butler | F16F 15/0232 | |
| 2017/0037928 A1 * | 2/2017 | Kronkright | F16F 7/01 | |
| 2017/0082532 A1 * | 3/2017 | Ryaboy | F16F 15/02 | |
| 2017/0167138 A1 * | 6/2017 | Thompson | E04C 3/122 | |

* cited by examiner

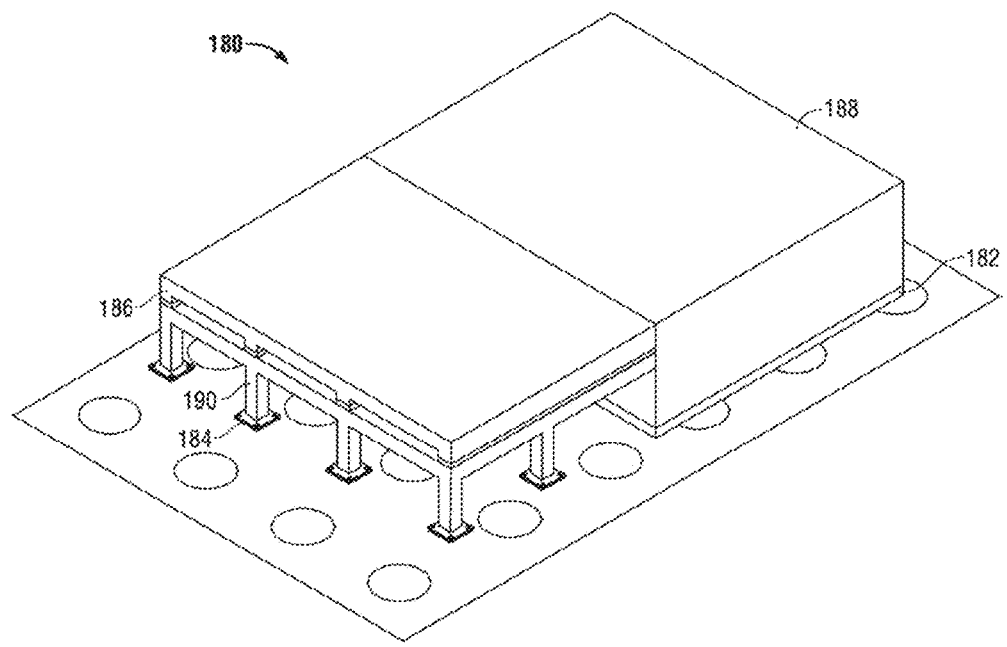
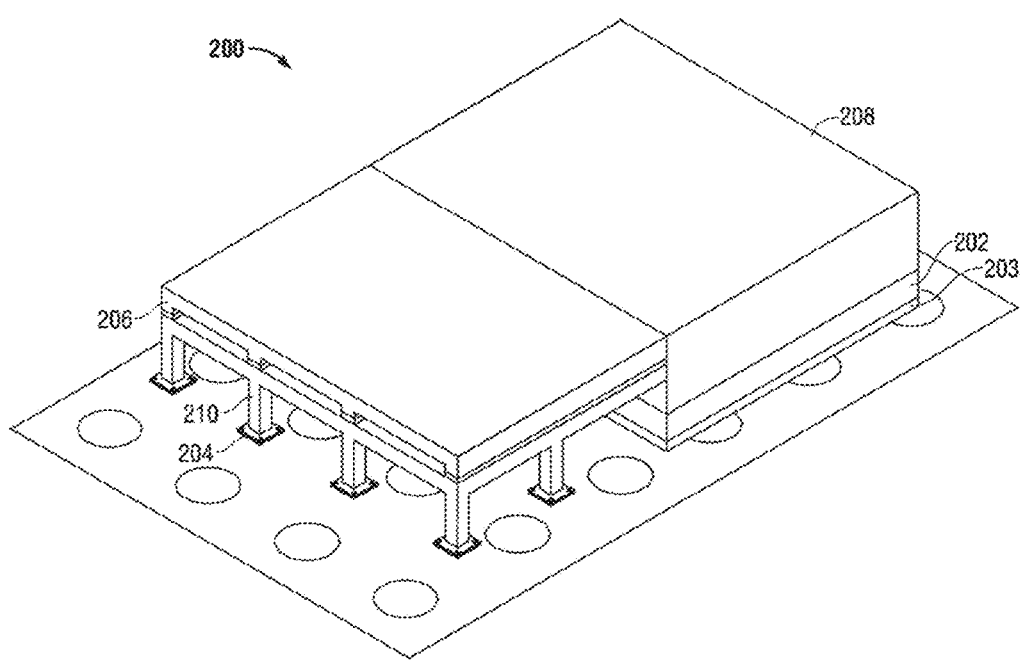

METHOD FOR IMPROVED SEMICONDUCTOR PROCESSING EQUIPMENT TOOL PEDESTAL / PAD VIBRATION ISOLATION AND REDUCTION

CROSS-REFERENCE TO RELATED APPLICATION

This application claims the benefit of the following non-provisional application, which is hereby expressly incorporated by reference in its entirety:

U.S. patent application Ser. No. 15/640,558, entitled "METHOD FOR IMPROVED SEMICONDUCTOR PROCESSING EQUIPMENT TOOL PEDESTAL/PAD VIBRATION ISOLATION AND REDUCTION," filed on Jul. 2, 2017.

BACKGROUND

Technical Field

The present disclosure relates to semiconductor and similar high precision processing facilities and, more particularly, to a method for improved semiconductor processing equipment tool pedestal/pad vibration isolation and reduction and the like. Additionally the present disclosure provides a method and system for improved semiconductor processing equipment vibration isolation and reduction by transforming vibration conducting properties of fabrication equipment as installed within a fabrication facility.

Description of the Background

Generally, the present disclosure relates to isolation of vibration frequency for Semiconductor tool pedestal/pad and raised floor system. The following description is intended to prepare the reader to better understand the various aspect of the present disclosure. It should be understood that these statements are to be read in this light, and not as admissions of prior art.

As semiconductor chips are advancing to smaller nanometer size, the need for isolation of unwanted vibration frequencies now takes a central position in fabrication facility design and operation. Low frequency vibration may affect production tools such as lithograph tools and, thereby, lower production yield rate in semiconductor fabrication. Foot traffic over raised floor systems, oscillating pumps, compressors, chillers, and AHUs (air handling units) produce low frequency vibrations transmitted through building and clean room floor structures. Many lines and pipes from pumps, compressors, chillers attach to pedestals under these tools without vibration isolation support mounts, contributing to unwanted vibration frequencies. Due to cost and installation time, only critical semiconductor production tools are equipped with vibration controlled and/or active isolation or vibration dampening tool pedestals and pads; most tools rely on their built in passive vibration isolation systems for vibration control.

Most semiconductor fabrication facilities are routinely remodeled, modified, and repurposed multiple times to accommodate new technology due to enormous building cost and prolonged build time. The majority of the semiconductor facilities are remodeled facilities and are designed for the previous equipment and vibration requirements, which were built 5, 10, or even 15 plus years ago.

New semiconductor tools have larger tool footprints and additional MEP lines accessed from below the tooling. To accommodate new semiconductor tools, heights of raised floor systems for the Process level or area have been increased; many steel and aluminum members also increased in size and diameter. In many instances, areas, which were not designed with "waffle floors", are raised even higher with elevated floor systems to meet cleanroom downdraft air movement specifications. As floors or tool pedestals are raised higher, many hollow steel or aluminum members are used to keep the weight and cost to a minimum.

Many semiconductor production support tools are capable of working and supporting new critical dimension production tools, such as lithography tools, with or without modifications. New production tools have tighter vibration frequency requirements, which are equipped with design specific vibration isolated tool pedestal and pads. However, new critical tools are usually operating in conjunction with older support tools with outdated vibration specifications. In many occasions, older tools only rely on their built-in passive vibration isolation systems for vibration control. Economically, replacing all support tools with matching vibration specifications for new key production tools is not feasible.

Improvement for isolation of vibration frequency transmitted through building structure is needed for better production yield rate. It must be economical, schedule driven, and with minimal weight for ease of material handling and installation.

One particularly important semiconductor tool platform for semiconductor device fabrication is the semiconductor tool pedestal, which provides a platform supporting the production equipment. The requirements for tool pedestal vary depending on the type. The structural requirements are stiffness, mass, and the vibration isolation mechanism. Of the many different types of semiconductor production tool pedestals, the lithography tool pedestal has demand for higher requirements. As the semiconductor chip node size decreases, the list of tool pedestals requiring higher requirements for stiffness, isolation/reduction of vibration increases. Such tools are chemical-mechanical planarization (CMP) tool and analysis tool. Other support tool pedestals are requiring higher levels of stiffness and reduction/isolation of vibration requirements due to the weight increase of the fabrication production tool, and the additional number and size of MEP access holes in the tool pedestals. Cost effective means to reduce/isolate vibration and ease of material handling and installation is needed.

Many older semiconductor production support pedestal tools still meet the design and strength requirements for supporting new critical production tools. New production tools have tighter requirements, such as stiffness, vibration isolation, and increased electromagnetic interference (EMI) barrier. Rewiring and/or retrofitting/adding shielding to all EMI emitting electrical lines around EMI sensitive tools to meet new EMI tolerance requirements are not economically feasible.

Disturbance from EMI may degrade the performance of semiconductor processing tools, largely affecting production yield rate. For such reason, most of the modern semiconductor fabrication facilities prohibit the personal use of radio, mobile, and other external EMI producing devices inside the FAB. All semiconductor processing tools are surrounded by power and communication data lines below the raised floor and tool pedestal system, producing certain levels of EMI. Modern semiconductor production tools have improved insulation from EMI; however, as the semiconductor industry is continuously evolving and gradually reducing the chip node sizes, improving the EMI barrier becomes crucial to many key production tools.

In light of the above, a further need exists for providing a method and system for improved semiconductor processing equipment vibration isolation and reduction.

There is a need for a method and system for eliminating or substantially reducing low frequency vibrations which may affect all production tools, such as lithograph tools, by lowering production yield rate in semiconductor fabrication.

There is a further need for a method and system for reducing or preventing the effects of vibration sources, such as foot traffic over raised floor system, pumps, compressors, chillers and AHUs (air handling units) that produce low frequency vibrations transmitted through building and clean room floor structures.

A need exists for a method and system to allow semiconductor production tools having tighter vibration frequency requirements to operate effectively in conjunction with older support tools with outdated vibration specifications.

Furthermore, a need exists for the ability to avoid the enormous expense of replacing all old support tools with new ones having vibration specifications matching new key production tools. That is, there is the need to eliminate or substantially reduce the considerations of vibration and noise control in equipment operation from decisions of how and when to replace older equipment.

In addition to the above concerns, there are concerns relating to the need for a method for improved semiconductor processing equipment tool pedestals/pad vibration isolation and reduction. The semiconductor industry is continuously evolving and gradually reducing the chip node sizes. The tool pedestal/pad (hereafter denoted as tool pedestal) for modern semiconductor FABs are required to have very small tolerance to ambient vibration. Therefore, reduction and isolation of vibration of tool pedestals is the key requirement for safe, reliable, and uninterrupted operation of modern semiconductor FABs.

Vibration causes deflection and deflection causes damaging effects to the costly high-precision machine tools. This, in turn, reduces the production yield rate. There is a need for a way to suppress the transmission of vibration from the supporting system to the machine tools.

A further need exists for, and enhanced the method for, improved semiconductor processing equipment tool pedestal vibration isolation and reduction that provides a cost-effective, easy-to-fabricate, easy-to-handle, and reliable solution to vibration suppression and isolation for semiconductor FABs.

SUMMARY

The disclosed subject matter provides for improved vibration control and protection for semiconductor fabrication equipment. Additionally, the present disclosure provides a method and system for improved semiconductor processing equipment vibration isolation and reduction using an integrated system for eliminating vibration conduction paths throughout the fabrication facility.

In light of the above, the present disclosure provides a method to improve vibration isolation in semiconductor process facilities. The present method and system essentially eliminates vibration frequencies transmitted through the building structure from production tools, pumps, compressors, chillers, AHUs (Air Handling Units), and footfall traffic on the raised floor system on to the tool pedestals and pads within semiconductor. The method and system use sound proofing material and/or vibration dampening material to fill, or partially fill, hollow steel and aluminum support members and sound proofing adhesives and caulks at points of connection in conjunction with mechanical fastening. In various applications, the present disclosure includes the placement of a shaped welded rod utilized for dissipating vibration energy in the center of a hollow member. The vibration energy dissipation rod is shaped and mechanically fastened to retain the vibration dampening materials it is encased in. Vibration dampening material may vary in type of material as epoxy mixture with composite material with high yield strength to vibration energy damping foam, per client's needs In summary, the present disclosure provides a method, system, and semiconductor fabrication facility that eliminates, or substantially reduces, process-limiting vibrations within a high-precision device manufacturing facility, wherein an elevated structure supports high-precision device manufacturing equipment and provides vibration reduction spacing between a floor and an upper surface of said elevated structure. The method comprises the steps of separating a base of the elevated structure from the floor using an optional solid vibration isolation pad structure. A vibration dampening material fills a hollow portion of a vertical support structure separating the base from said upper surface. An optional second vibration isolation pad structure separates the vertical support structure from the upper structure of the elevated structure. In the present disclosure, the first solid vibration isolation pad structure, the vibration dampening material, and the optional second isolation pad structure coordinate to eliminate, or substantially reduce, the ability of vibrations from the floor to reach high-precision device manufacturing equipment operating on the upper surface of said elevated structure.

According to present examples, the disclosure includes a method, system, and semiconductor fabrication facility for eliminating, or substantially reducing, process-limiting vibrations within a high-precision device manufacturing facility. In such a disclosure, an elevated structure supports high-precision device manufacturing equipment and provides vibration reduction spacing between a floor and an upper surface of said elevated structure. Here, the examples involve separating a base of the elevated structure from the floor using a first solid vibration isolation pad structure. In addition, the present disclosure includes filling a hollow portion of a vertical support structure with a vibration absorbing or vibration dampening materials. The disclosure includes separating the vertical support structure from the upper structure of the elevated structure using a second vibration isolation pad structure. Accordingly, the coordination of the first vibration isolation pad structure, the vibration dampening materials or vibration absorbing materials, and the second isolation pad structure coordinate to eliminate, or substantially reduce, the ability of vibration from the floor to reach high-precision device manufacturing equipment operating on the upper surface of the elevated structure.

Application of the disclosed method and system improves isolation of vibration frequencies transmitted through building structures from tools in operation in the process level (older support tools work with new key production tools) to pumps, compressors, chillers, AHUs (Air Handling Units), and footfall traffic on raised floor systems on to tool pedestals/pads.

The disclosed method and system include the use of dedicated MEP (mechanical, electrical, plumbing) support pedestals, only attached as support for MEP lines, to improve isolation of low frequency vibrations. With minimal weight increase for material for ease of material handling and installation, this method is intended for tools without specifically designed vibration frequency dampening and isolation tool pedestals/pads. These only relied on their built in passive vibration isolation systems.

A technical advantage of the present disclosure includes reduction and isolation of vibration frequencies for improving production yields as semiconductor chip design is advancing in smaller nanometer critical dimensions for semiconductor device processing.

Another technical advantage of the present disclosure includes the ability to use the disclosed vibration isolation structures in addition to industry standard structures such as construction isolation joints, miniature damping pads between raised floor tiles to pedestal, and vibration isolation connectors for MEP lines.

Additionally, the present disclosure includes the improved isolation of vibration frequencies transmitted through the building structure to achieve better production yield rates. The method and system of the present disclosure are economical, schedule driven, and impose minimal weight in the construction of material handling and installation facilities for nanometer-scale semiconductor fabrication facilities and similar high precision lithography and fabrication environments. As a result of the present teachings, semiconductor fabrication yields and process efficiencies greatly improve.

Another beneficial aspect of the present disclosure is a method and system for eliminating, or substantially reducing, low frequency vibrations which affect production tools, such as lithograph tools, so as to increase lithographic accuracy and yield percentages in semiconductor device fabrication.

Yet another technical advantage of the present disclosure includes the reduction of effects from vibration sources, such as foot traffic, over raised floor system, pumps, compressors, chillers and AHUs (air handling units) that produce low frequency vibrations transmitted through building and clean room floor structures.

Another technical advantage of the present disclosure includes the ability to allow newer semiconductor production tools having tighter vibration frequency requirements to operate effectively in conjunction with older support tools with outdated vibration specifications. The ability to extend the useful life of older equipment may result in process expense reductions and greater operational profits for semiconductor device fabrication facilities.

Technical advantages of the present disclosure include providing a hybrid system for eliminating/substantially reducing multiple vibration frequencies to include high and low vibration frequencies. High frequency vibrations may be considered, for example, Workshop (ISO), Office (ISO), Residential Day (ISO), and Operating Theatre (ISO) ranges of vibration, as defined here by the chart of FIG. 16. Low frequency vibrations may be considered those vibrations classified as VC-C, VC-D, and VC-E in FIG. 16. The teachings of the present disclosure provide the ability to establish an environment operating in the range of VC-E.

Another technical advantage of the present disclosure includes providing a passive vibration isolation system using composite materials which may include composite vibration dampening materials within the structures for vibration isolation. This design permits vibration isolation without having to modify entire structures, as well as with minimal overall weight variations as a result of vibration isolation modifications. This flexible design may be tailored to meet client's special needs by addition or subtraction of different materials and components. The teachings of the present disclosure permit installation of composite vibration dampening material within structural components with minimal disruption in fabrication facility operations. As a result, the significant improvements of the present subject matter afford major operational and efficiency improvements with an economical set of structural transformations to increase overall fabrication facility profitability and efficiency.

Finally, the present method and system provide the ability to avoid the enormous expense of replacing all old support tools with new ones having vibration specification matching new key production tools. In effect, the present disclosure enables the elimination, or substantial reduction, of many considerations of vibration and noise control in equipment operation.

BRIEF DESCRIPTION OF THE DRAWINGS

The present subject matter will now be described in detail with reference to the drawings, which are provided as illustrative examples as to enable those skilled in the art to practice the subject matter. Notably, the FIGUREs and examples are not meant to limit the scope of the present subject matter to a single embodiment, but other embodiments are possible by way of interchange of some or all of the described or illustrated elements and, further, wherein:

FIG. 11 provides a 3D view of a concrete tool pedestal employing teachings of the present disclosure;

FIG. 12 shows a concrete and porous high strength metal combined to make hybrid tool pedestal/pad exhibiting teachings of the present disclosure;

DESCRIPTION OF ILLUSTRATIVE EMBODIMENTS

Figure 1:
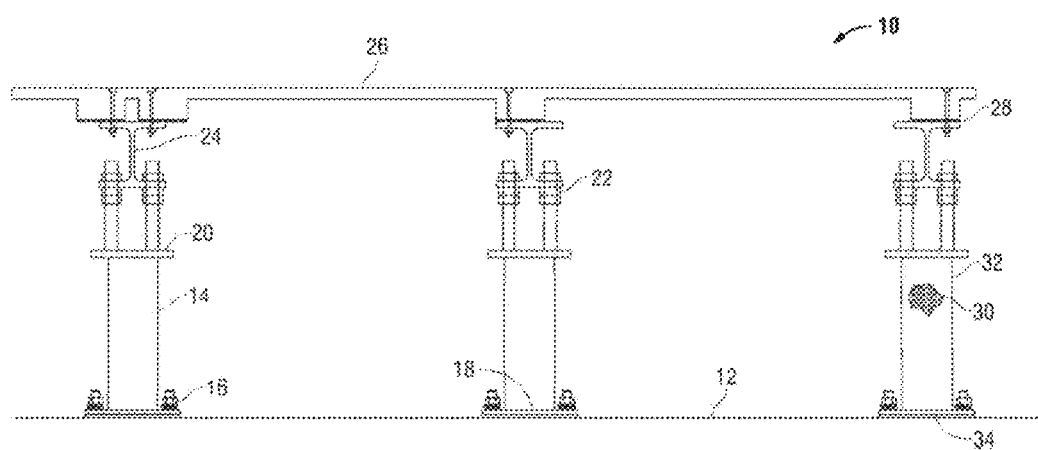
FIG. 1 shows a metal tool pedestal and pad with adjustable height hollow steel member pedestal configured consistent with the teachings of the present disclosure.

The detailed description set forth below, in connection with the appended drawings, is intended as a description of exemplary embodiments in which the presently disclosed process can be practiced. The term "exemplary" used throughout this description means "serving as an example, instance, or illustration," and should not necessarily be construed as preferred or advantageous over other embodiments. The detailed description includes specific details for providing a thorough understanding of the presently disclosed method and system. However, it will be apparent to those skilled in the art that the presently disclosed process may be practiced without these specific details. In some instances, well-known structures and devices are shown in block diagram form in order to avoid obscuring the concepts of the presently disclosed method and system.

In the present specification, an embodiment showing a singular component should not be considered limiting. Rather, the subject matter preferably encompasses other embodiments including a plurality of the same component, and vice-versa, unless explicitly stated otherwise herein. Moreover, applicants do not intend for any term in the specification or claims to be ascribed to an uncommon or special meaning unless explicitly set forth as such. Further, the present subject matter encompasses present and future known equivalents to the known components referred to herein by way of illustration.

The present disclosure shows a method to improve vibration isolation in the semiconductor process level. Vibration frequencies transmitted through the building structure from production tools, pumps, compressors, chillers, AHUs (Air Handling Units), and footfall traffic on raised floor systems on to tool pedestals/pads, within the semiconductor facility are eliminated or substantially reduced. The present method and system use sound proofing material and/or vibration dampening materials in hollow steel or aluminum support members and sound proofing adhesives and/or caulking at point of joint connections in conjunction with mechanical fastening. In various applications, the present disclosure includes the placement of a shaped welded rod for dissipating vibration energy in the center of hollow members, such as vertical posts or pedestals, which are surrounded with sound proofing material and/or vibration dampening materials.

In addition, utilization of this method may be for dedicated MEP (mechanical, electrical, plumbing) support pedestal, only attach as support for MEP lines, as to improve isolation of low frequency vibrations. As semiconductor chip design is advancing in smaller nanometer critical semiconductor device dimensions, reduction and isolation of vibration frequencies is needed for improving production yield.

The subject matter of the present disclosure eliminates or substantially reduces shorts in sound transmission by creating barriers and spaced openings from the ground or base level through the support vertical components to the equipment platforms they're above. The support vertical components with vibration dampening materials are used in conjunction with the single or multiple solid composite vibration isolation pads between metal structures and physical structures for receipt and transmission of vibrations at low frequency. Low frequency can adversely affect the operation of nanoscale semiconductor fabrication equipment.

Without use of equipment such as active vibration control equipment, there may be rubber pads and other elastic pads to isolate metal from metal. However, over time such structures as rubber pads can become densified or brittle. In either case, a sound short may arise between the metals and be transmitted through the densified or brittle rubber or other dissipative material that otherwise would be used. This would cause unwanted vibration transmission.

In the present disclosure, as opposed to rubber pads, sound isolation caulking may be placed between the metal structures. Sound isolation caulking has properties of avoiding densification or brutalization. As a result, sound and vibration are isolated at the unwanted frequencies. With rubber pads and the like dissipative material, there may be small voids that arise between the rubber pads on the metal surfaces. Instead of using such pads, or isolation structures, the optional use of sound isolation caulking allows for variations in dimensions and surface anomalies and yet provides sound isolation for structures that is continuous to fully prevent vibration transmission across the metal components.

By employing vibration dampening materials between the metal structures, or, perhaps, solid vibration composite isolation plates and/or additional vibration dampening adhesives, the disclosure shows vibration reduction from one metal structure to another.

FIG. 1 is an example of a metal tool pedestal pad with an adjustable height hollow steel member pedestal. With reference to FIG. 1, metal tool pedestal 10 on floor 12 upon which adjustable hollow steel number 14 rests, with bolts 16 through base 18, and screw or otherwise fasten into floor 12. Adjustable height hollow steel member pedestal 14 includes vertical adjustment mechanism 20. Connecting at the top of vertical adjustment mechanism 20 appears bolt mechanism 22 bolted to I-beam 24. I-beam 24 bolts to metal tool pedestal base 26.

Metal tool pedestal 10 further includes sound proofing adhesive which may be used in conjunction with solid composite vibration isolation plate 28 positioned between I-beam 24 and pedestal base 26. Within hollow portion 30 of adjustable height hollow steel member 14 appears sound proofing material and/or vibration dampening materials 32. Between base 18 and floor 12, the present disclosure includes sound proofing adhesive and/or vibration dampening materials 34.

Although the metal tool pedestal 10 has a single-stacked structure including one stack of the hollow steel member 14 and the metal tool pedestal base 26 in FIG. 1, the metal tool pedestal may have a multiple-stacked structure including multiple stacks of hollow steel members and multiple stacks of metal tool pedestal bases alternately disposed with each other in another embodiment. For example, a first hollow steel member may be disposed on the floor 12, and a first metal tool pedestal base may be disposed on the first hollow steel member. In addition, a second hollow steel member may be disposed on the first metal tool pedestal base, and a second metal tool pedestal base may be disposed on the second hollow steel member. The vibration may be further reduced by the multiple-stacked structure.

Figure 2:
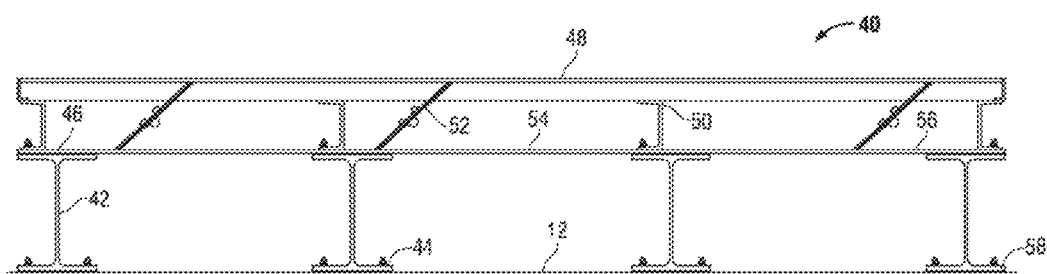
FIG. 2 depicts a concrete type tool pedestal supported with structural steel configured consistent with the teachings of the present disclosure.

FIG. 2 is an example of concrete type tool pedestal supported with structural steel. With reference to FIG. 2, concrete type tool pedestal 40 includes structural steel beams 42 supported by base members 44. Structural beams 42 include upper joint 46 in a "T" shape and supporting pedestal base 48. Between pedestal base 48 in upper joint 46 appear metal spacers 50. Ties 52 provide further association between pedestal base 48 and upper joint 46. Spacers 50 connect between pedestal base 48 and bottom surface 54 and may be formed of a variety of materials to achieve multiple vibration frequency isolation.

Sound proofing adhesive and/or vibration dampening materials 56 serves as a vibration barrier between "T" portion 46 and bottom surface 54. Similarly, vibration dampening material 58 separates base member 44 and floor 12.

Figure 3:
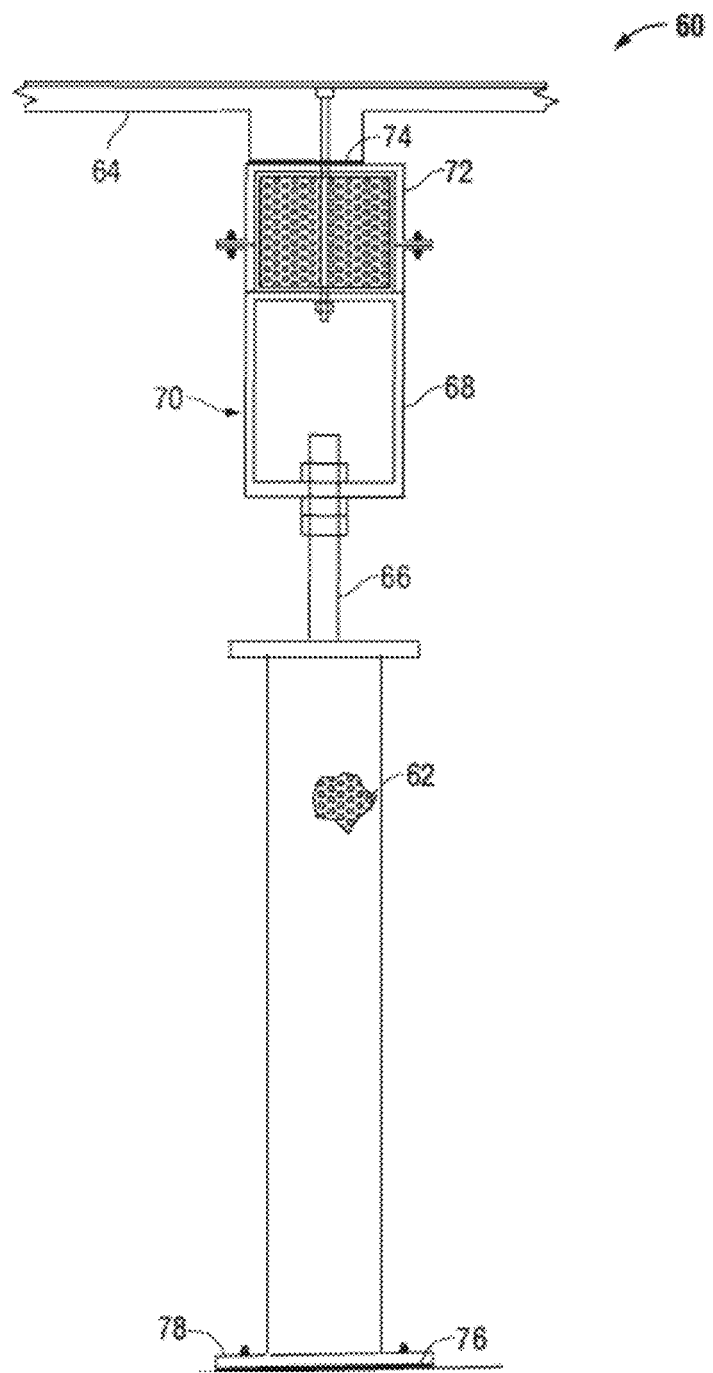
FIG. 3 exhibits a hollow horizontal structural member configured consistent with the teachings of the present disclosure.

FIG. 3 is an example of a hollow vertical structural member filled with sound proofing material and/or vibration dampening material for a raised floor system. With reference to FIG. 3, hollow vertical structural member 60 may be filled with sound proofing material and/or vibration dampening material 62. Hollow vertical structural number 60 may be used for a raised floor system 64 and a metal pedestal.

Connecting from hollow vertical structural number 62 appears vertical tie 66 into hollow vertical support element 68. Hollow vertical support element 68's upper portion 70 may be filled with sound proofing material and/or vibration dampening material 72. In addition, solid composite vibration isolation plate and/or vibration dampening material 74 separates hollow vertical support element 68 from raised floor system 64. Likewise, solid composite vibration isolation plate and/or vibration dampening material 76 separates base 78 of hollow vertical support member 60 from floor 12.

Figure 4:
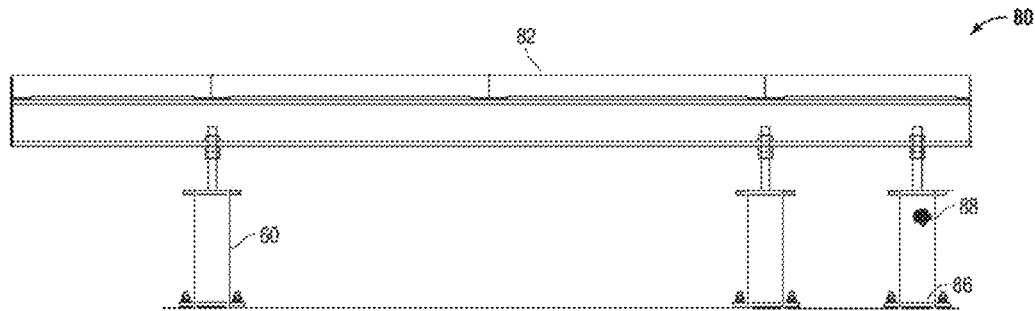
FIG. 4 presents a raised floor system on an adjustable hollow steel pedestal configured consistent with the teachings of the present disclosure.

FIG. 4 is an example of a raised floor system on an adjustable hollow steel pedestal. With reference to FIG. 4, vibration isolation platform 80 includes an example of a raised floor system 82 supported by an adjustable hollow steel pedestal 60 to create a vibration isolation platform. As illustrated above, sound proofing material and/or vibration dampening material 84 may be used to fill adjustable hollow steel pedestal 60 with a solid composite vibration plate and/or vibration dampening material 86 separating adjustable hollow steel pedestal 60 from floor 12.

FIG. 4 illustrates a type of structure which may be a metal support I-beam going across a vibration isolation platform. At the point of contact there is vibration isolation. Sound proofing material and/or vibration dampening material may be placed at the top of the platform beneath the platform stanchion, and along the vertical wall of the stanchion. The use of sound proofing material and/or vibration dampening materials provides a reduction of vibration from the floor that it may be receiving equipment vibrations through and prevents transmission of such vibrations up the vertical supports. It further provides a barrier as any further vibration may pass from the vertical support to the upper horizontal platform surface.

Figure 5:
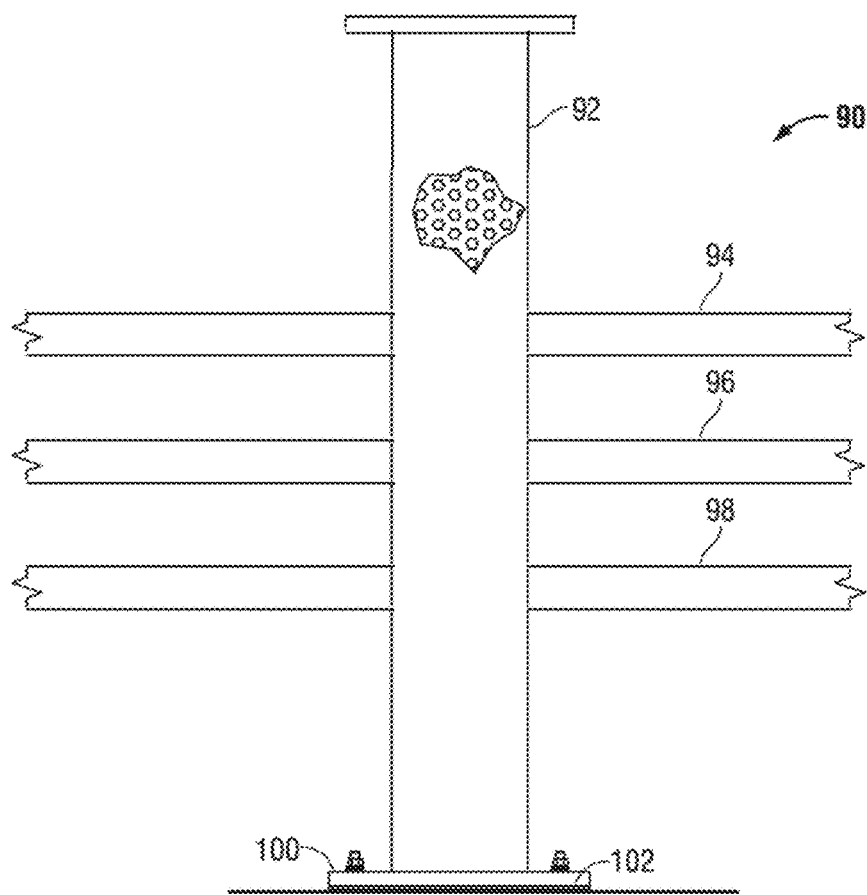
FIG. 5 shows a pedestal dedicated for MEP (mechanical, electrical, plumbing) line support configured consistent with the teachings of the present disclosure.

FIG. 5 is an example of a pedestal dedicated for MEP (mechanical, electrical, plumbing) line support. With reference to FIG. 5, pedestal configuration 94 passing mechanical, electrical, plumbing (MEP) line support while maintaining or improving sound or vibration isolation within the fabrication equipment setting. Pedestal 92 passes or allows the passage of mechanical line 94, electrical line 96, and plumbing line 98. Base 100 supports pedestal 92 with solid composite vibration isolation plate with optional vibration dampening adhesive 102, separating base 100, and therefore pedestal 92, from vibrations that may exist from floor 12.

FIG. 5 shows imposition of MEP lines in pedestal configuration 94 structures and how such might be vibration isolated for the purpose of the present disclosure. With MEP lines on the top of the support structure for such equipment, there is frequently the attachment of the equipment to the vertical support structures. Such attachment ultimately results in a sound transmission path from the vertical stanchion or support to the supported equipment on the horizontal platform. Dedicated semiconductor MEP pedestal may be mounted to wall, column, ceiling and floors in different configurations with U channel pre-attached and solid composite vibration isolation plate for universal mounting options.

Figure 6:
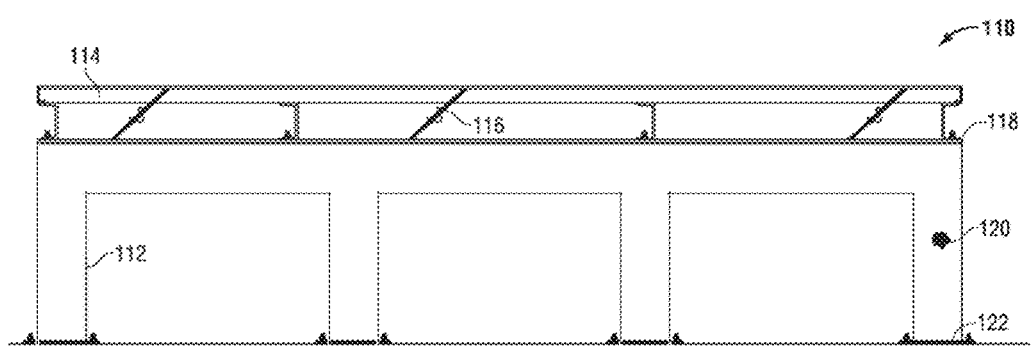
FIG. 6 presents a concrete type tool pedestal and pad configured consistent with the teachings of the present disclosure.

FIG. 6 is an example of a concrete type tool pedestal/pad supported with hollow structural steel/aluminum filled with sound proofing material and/or vibration dampening material at point of connections. With reference to FIG. 6, concrete type tool pedestal 110 is supported with hollow structural steel/aluminum filled support 112, providing structural support for concrete beam 114. Ties 116 on concrete beam 114 in position relative to hollow structural steel/aluminum supports 112. Between concrete beam 114 and filled structural steel/aluminum supports 112, appears solid composite vibration isolation plate and/or vibration dampening material 118.

Note that hollow structural steel/aluminum filled supports 112 may also receive soundproofing adhesive or vibration dampening material 124. In addition, solid composite vibration isolation plate 122 may likewise be of use in separating vibration from floor 12 to hollow structural steel/aluminum supports 112, optionally filled with sound proofing and/or vibration dampening material.

Figure 7:
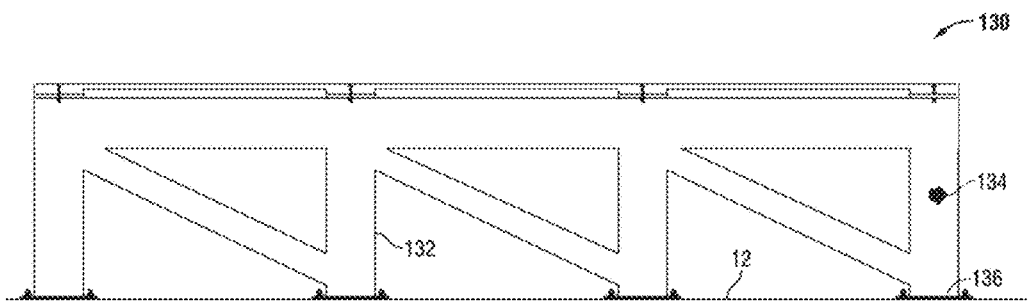
FIG. 7 depicts a metal type tool pedestal and pad configured consistent with the teachings of the present disclosure.

FIG. 7 is an example of a metal type tool pedestal supported with hollow structural steel/aluminum filled with sound proofing material and/or vibration dampening material and optional vibration dampening adhesive or caulking at point of connections. With reference to FIG. 7, metal type tool pedestal 130 supported by hollow structural steel/aluminum filled supports 132. Hollow structural steel or aluminum supports 132 may be filled with sound proofing material and/or vibration dampening material 134. Between hollow structural steel/aluminum filled supports 132 and floor 12 also appear solid composite vibration isolation plate and/or vibration dampening material 136.

Figure 8:
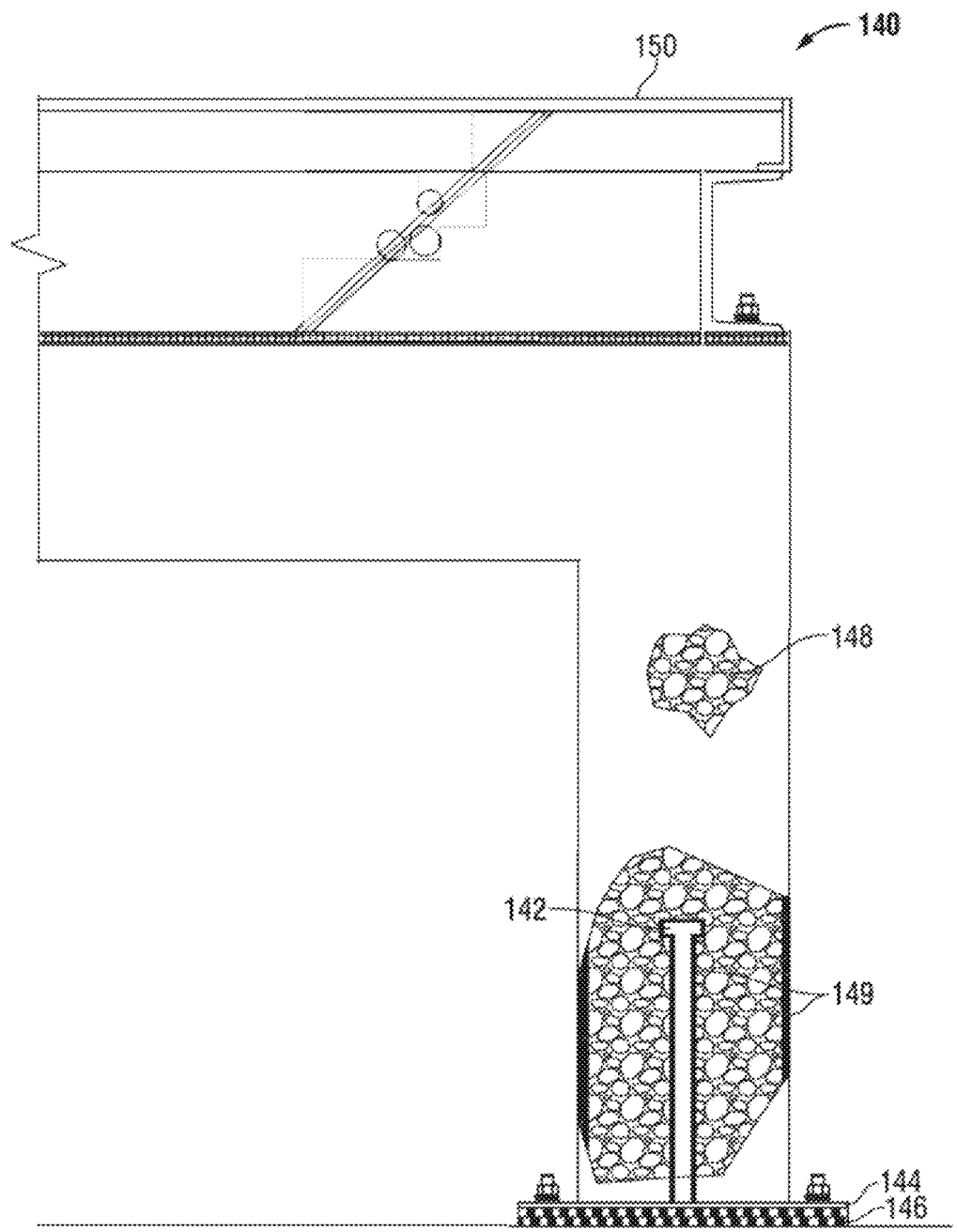
FIG. 8 displays square hollow member configured consistent with the teachings of the present disclosure.

FIG. 8 is an example of a square hollow member with a shaped vibration energy dissipating rod encased in sound proofing material and/or vibration dampening materials and optional vibration dampening adhesive/caulking at point of connections. With reference to FIG. 8, square hollow member 140 further includes vibration energy dissipating rod 142 that attaches to base 144. From base 144 through vibration energy dissipating rod 142, energy that may be sensed from the floor 12 may be directed into the sound proofing material and/or vibration dampening material 146. Energy dissipating rod is encased in energy dampening materials 148 and 149 in which vibration is dissipated. Solid composite vibration isolation plate or multiple solid composite isolation plates are shown as 146. In addition, square member 140 may include an inner solid composite vibration isolation plate and/or vibration dampening material 146 that may isolate vibration from the exterior surface of square hollow number 140 into 146. Thus, square member 140 architecture of FIG. 8 illustrate some sound barriers or vibration barriers that substantially reduce and convert to non production damaging frequencies, any vibration from floor 12 to upper pedestal layer 150.

The vibration isolation system aims for creating a barrier by absorbing part of the external vibration transmitted through the concrete/steel interface and confine it within the steel tube capsule by means of several energy absorbers. The energy dissipation mechanism constitutes a steel tube or hollow steel member, shaped energy dissipation rod mechanism with vibration dampening materials in between the shaped rod and the tube wall; internally. It is foreseen that the energy dissipation rod may exhibit piston-type behavior due to the presence of the composite high strength and high yield energy dissipative material. The type of vibration expected and the range of frequencies needing suppression would determine the design properties of the components in the energy absorption mechanism. This includes sizing of the steel tube, top and bottom cap plates, geometry of the rod, and densities of the vibration dampening materials.

Figure 9:
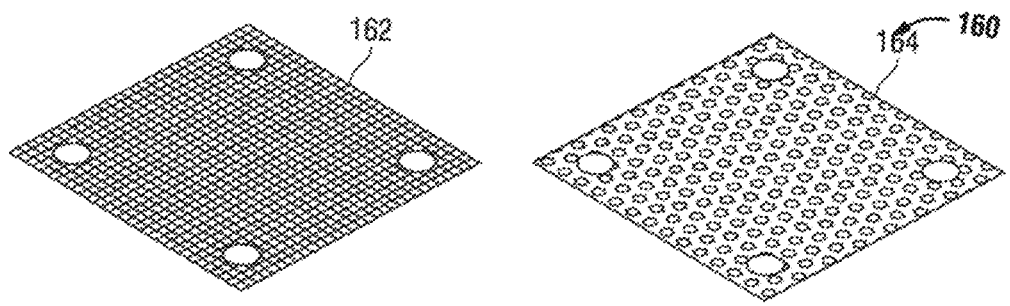
FIG. 9 shows part of a tile assembly for limiting vibration transmission throughout the semiconductor equipment platform structure.
Figure 10:
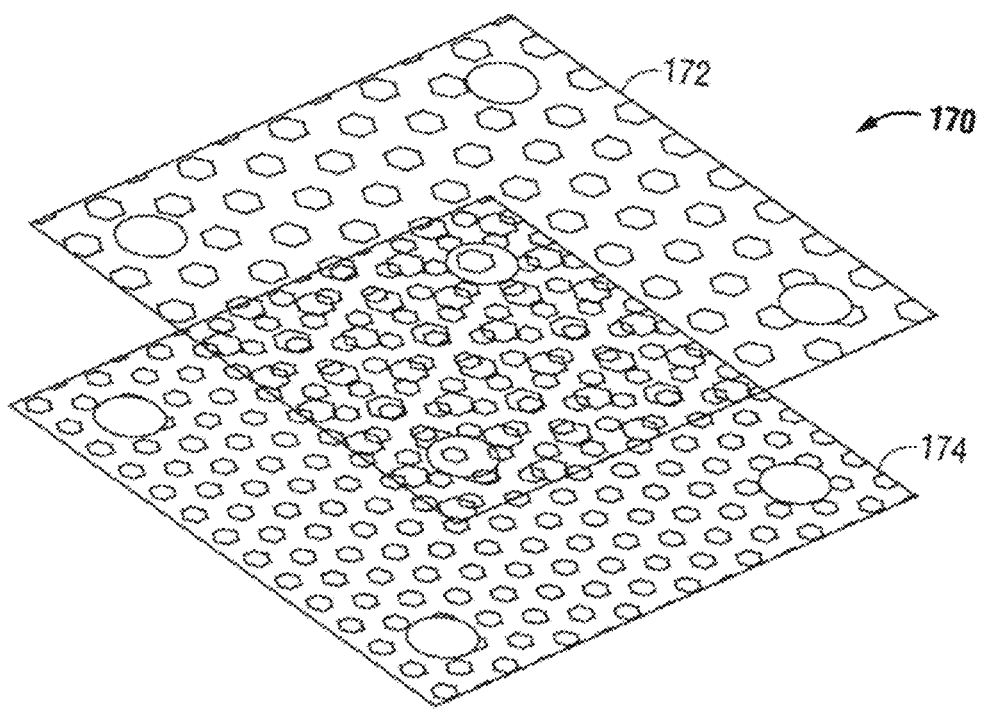
FIG. 10 depicts further aspects of a tile assembly for limiting vibration transmission throughout the base of a semiconductor equipment platform structure.

FIGS. 9 and 10 show part of a tile assembly for limiting vibration transmission throughout the semiconductor equipment platform structure. With reference to FIG. 9, tile set 160 includes first tile 162 and second tile 164. First tile 162 includes a screen or mesh/perforated plate configuration for use on surfaces associated with a semiconductor equipment platform structure such as exhibited above FIGS. 1 through 8.

Note that the configuration of tiles 162 in tile 164 is such that the spacing between openings in tile 162 is smaller than the openings in tile 164. This has a limited vibration energy transmission effect in the sense that it substantially reduces, sinusoidal vibration transmissions.

FIG. 10 depicts further aspects and a possible example of a tile assembly for limiting vibration transmission throughout the base of a semiconductor equipment platform structure. With reference to FIG. 10, tile configuration 170 includes upper tile 172, which has different opening and spacing dimensions from lower tile 174. As such, tiles are assembled in such a manner that the transmission of noise along, or into, a vibration dissipating platform may substantially improve.

Considering both tile assembly 160 of FIG. 9 and tile assembly 170 of FIG. 10, and with reference to FIG. 8, notice that solid composite vibration isolation plate and/or vibration dampening material 146 rests beneath base 144 of the structural member 140. This association of two separate tiles to mitigate vibration transfer from floor 12 to structural member 140 has proven to be markedly effective in eliminating or substantially reducing transmission of vibration.

Although not shown, the openings of the tiles 162, 164, 172 and 174 may be filled with a vibration absorbing material such as thermoplastic polymer. Transmission of the vibration is reduced due to the vibration absorbing material. With vibration damping material in the voided spaces, it creates a Solid Composite Isolation Plate. Solid Composite Vibration Isolation Plate improves vibration isolation, reduce vibration amplitude and improve vibration regularization.

FIG. 11, shows a 3D view and example of hybrid material mixed concrete tool pedestal 180. It is composed of concrete tool pedestal 188 bonded with vibration dampening adhesive 182 next to metal type tool pedestal 190 with solid composite vibration isolation plate and/or vibration dampening material 184, set in a clean room with waffle floor. Vibration dampening adhesive or caulking is used at the points of connection 186.

FIG. 12 provides an overall view of metal and hybrid concrete tool pedestal 200, consisting of Hybrid concrete 208 and porous high strength metal 202 combined to make hybrid tool pedestal/pad on top of solid composite vibration dampening plate 203 and may also include multiple perforated spacers with sound proofing and/or vibration dampening material. Hybrid concrete pad is next to metal type tool pedestal 206 sitting on top of metal frame member 210. In between clean room waffle floor and the metal structure lies solid composite vibration isolation plate and/or vibration dampening material 204.

With the present discloser there may be different configurations for placement/position of the vibration isolation material, to include concrete, porous high strength metal, type of steel layer, and composite vibration isolation plate, may be placed in different sequence of layers. Such examples may address the need for a low center of gravity; high porous high strength metal may be on top of the concrete to include type of heavy or thick steel added to the bottom for added weight. The type of production equipment, contact surface, or location of equipment needed within the production area may dictate the position and location of concrete, porous high strength metal, steel plating, and solid composite vibration isolation plates including different sequences and positions.

Using a porous metal with high strength provides excellent vibration reduction performance. Aluminum and its alloys offer a wide range of properties that can be engineered precisely to the demands of specific applications, such as in aerospace, advanced nuclear reactors, and surface coating, through the choice of alloy, temper condition and fabrication process. By utilizing various combinations of its advantageous properties such as strength, lightness, corrosion resistance, recyclability, and formability, aluminum is being employed in an ever-increasing number of applications. The methods and teachings of the present disclosure provide one such application for which aluminum alloys such as 6061 or 6062, with T1 or T2 thermal stress treatments may be desirable for both vibration reduction and weight bearing.

Referring to FIGS. 11 through 15, perforated metal can be cut to different sizes. Due to differences in the table/platform with legs, the tool pedestal is sitting on the waffle floor in the process level. The following figures show how the present teachings address the requirement of platforms to be formed in different configurations. Accordingly, modifications to perforated metal designs include the placement of vibration dampening material in the voided spaces and sandwiching or by any other means, are considered within the teachings of the present disclosure forming solid composite vibration isolation plate. Perforated metals with different size voids (overlapping between the metal layers) filled with vibration dampening material (creating hybrid vibration dampening/isolation barrier), may be layered for vibration dampening or isolation, as needed, and be well within the present scope. That is, high strength porous metal may be on top or bottom or middle or any combination thereof. Examples of such configurations now follow.

Figure 13:
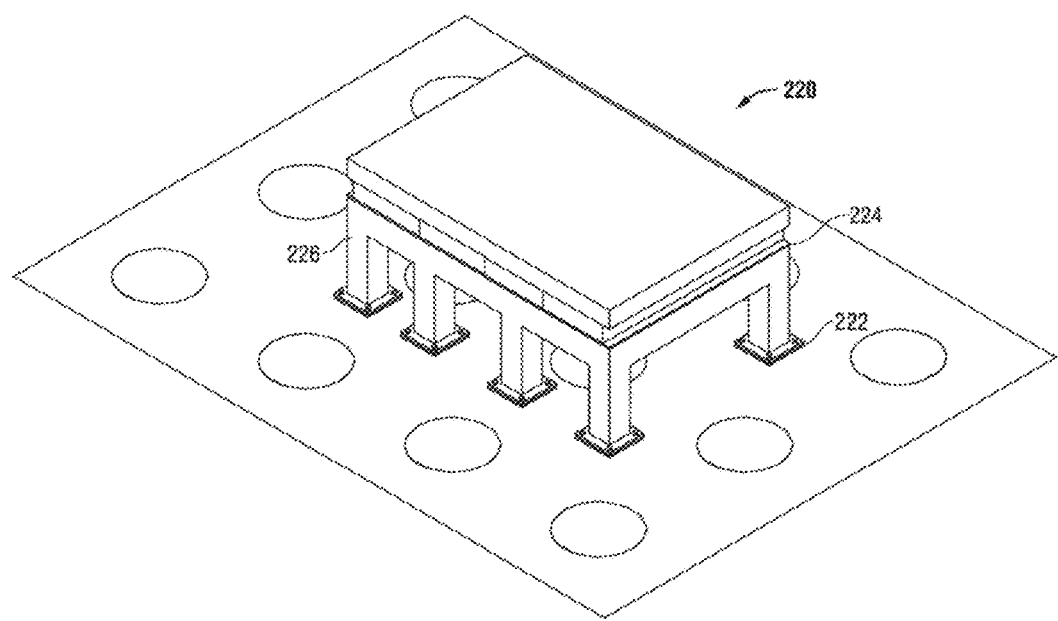
FIG. 13 is a 3-D view of a concrete encased in metal type tool pedestal/pad with multiple perforated spacers according to teachings of the present disclosure.

FIG. 13 is a 3-D view of concrete encased metal type tool pedestal 220 on top of steel structure 226 with vibration dampening material 224 at point of contact, and assembly on solid composite vibration isolation plates and/or vibration dampening material 222 set in clean room with waffle floor.

Figure 14:
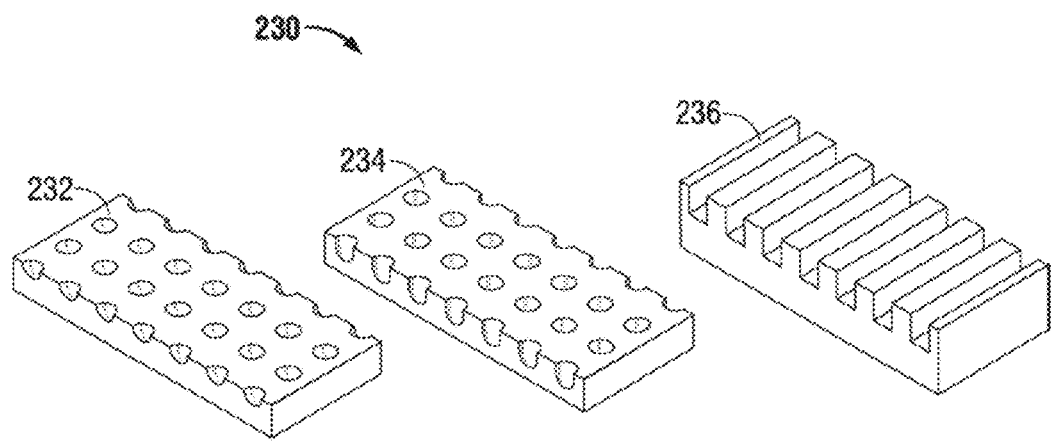
FIG. 14 shows a 3-D view of a high strength porous metal structure with voided spaces according aspects of the present disclosure.

FIG. 14 is a 3-D view of examples 230, including examples 232, 234, and 236, of high strength porous metal with voided spaces filled with vibration dampening material in voided area. The size of void spaces, pattern, and thickness varies for type of applications wherein such porous metals may be used for the desired vibration isolation.

Figure 15:
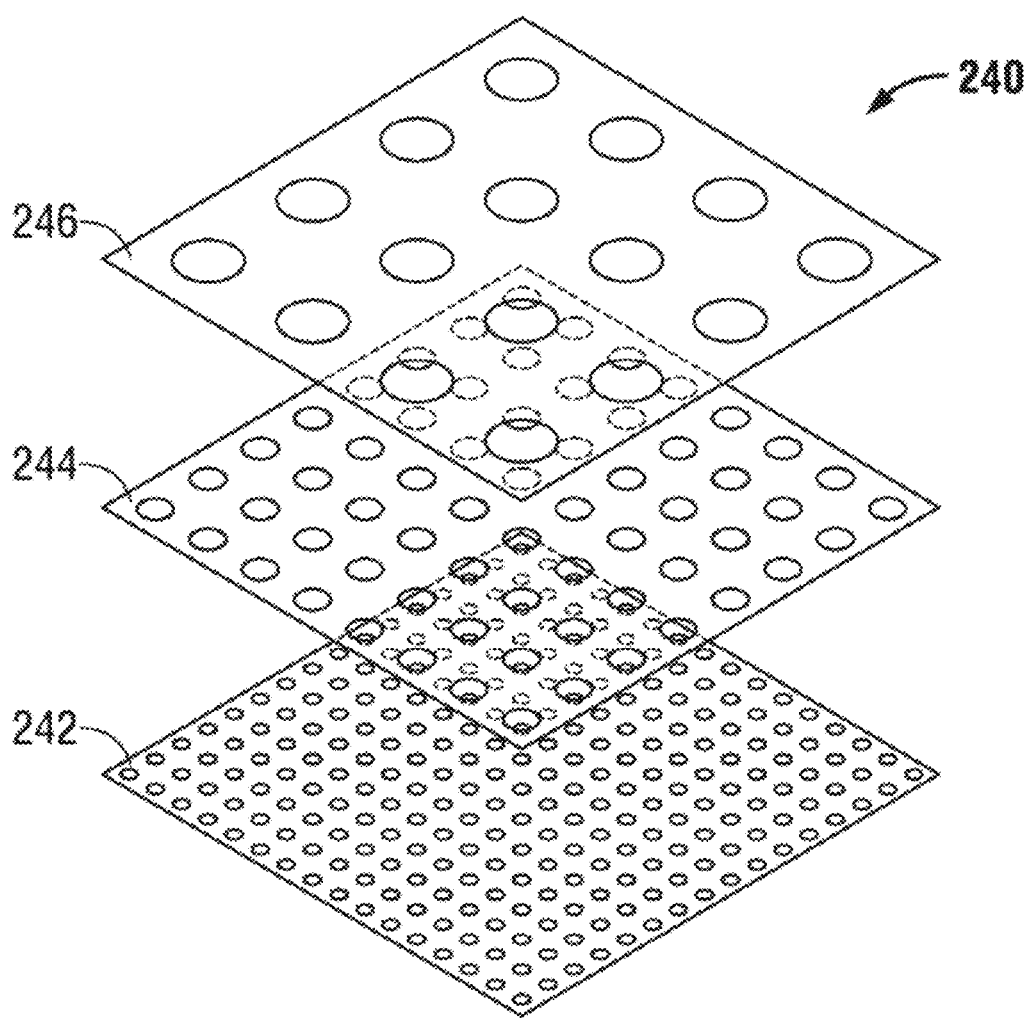
FIG. 15 provides a 3-D view of multiple layers of perforated high strength porous metal according to the present disclosure.

FIG. 15 is a 3-D view of examples 240, including examples 242, 244, and 246 of multiple hybrid dampener layers of perforated high strength porous metal filled with vibration dampening material in voided area. Note that the size, shape of void spaces, pattern, and thickness may vary for different types of applications. With vibration damping material in the voided spaces, it creates a Solid Composite Isolation Plate. Solid Composite Vibration Isolation Plate improves vibration isolation, reduce vibration amplitude and improve vibration regularization.

Perforated metal spacers formed from materials such as examples 240 may be made from high strength, porous metal, including aluminum alloy such as 6061 or 6062, T1 or T2 heat treated aluminum. With such materials, void spaces may be filled with vibration dampening material. If needed, metal spacers may be double layered with different size openings to overlap the bottom or other plate for better combined exposure to better vibration dampening material Since it is perforated high strength metal, it can be tightened down. Also, material, including the metal, is noncorrosive with negative ion properties.

An important aspect of the present disclosure includes the use of composite vibration dampening material and non-usage of rubbery material at the structural base. The rubber gasket is insufficient because of the movement and compressibility associated with pure rubber or elastic dissipative material. Movement and compressibility are unacceptable for semiconductor production, because movement affects lithographic accuracy and deposition alignment. Instead, the present disclosure provides the vibration isolation aspect of a non-rubbery or non-elastic material, as well as the necessary strength and lack of movement/compressibility. High strength porous metal finds attractive use in the subject disclosure, because it avoids compressibility. Moreover, by filling void space areas with vibration dampening materials certain advantages arise. The present subject matter makes novel use of different sized perforated spacings. As such, overlapping voided spaces prevent metal-on-metal contact. Preventing metal-on-metal contact avoids, or substantially reduces, any possible direct vibration conduction path. The result becomes a marked improvement in vibration isolation for even the most delicate semiconductor device processes.

The present disclosure provides a fundamentally different type of solid passive vibration isolation pad from ones within the prior art. All anti vibration pads are compressible and semi rigid, or active vibration controlled, which is not cost feasible for the whole FAB. The vibration isolation material of the present disclosure provides a different design.

Figure 16:
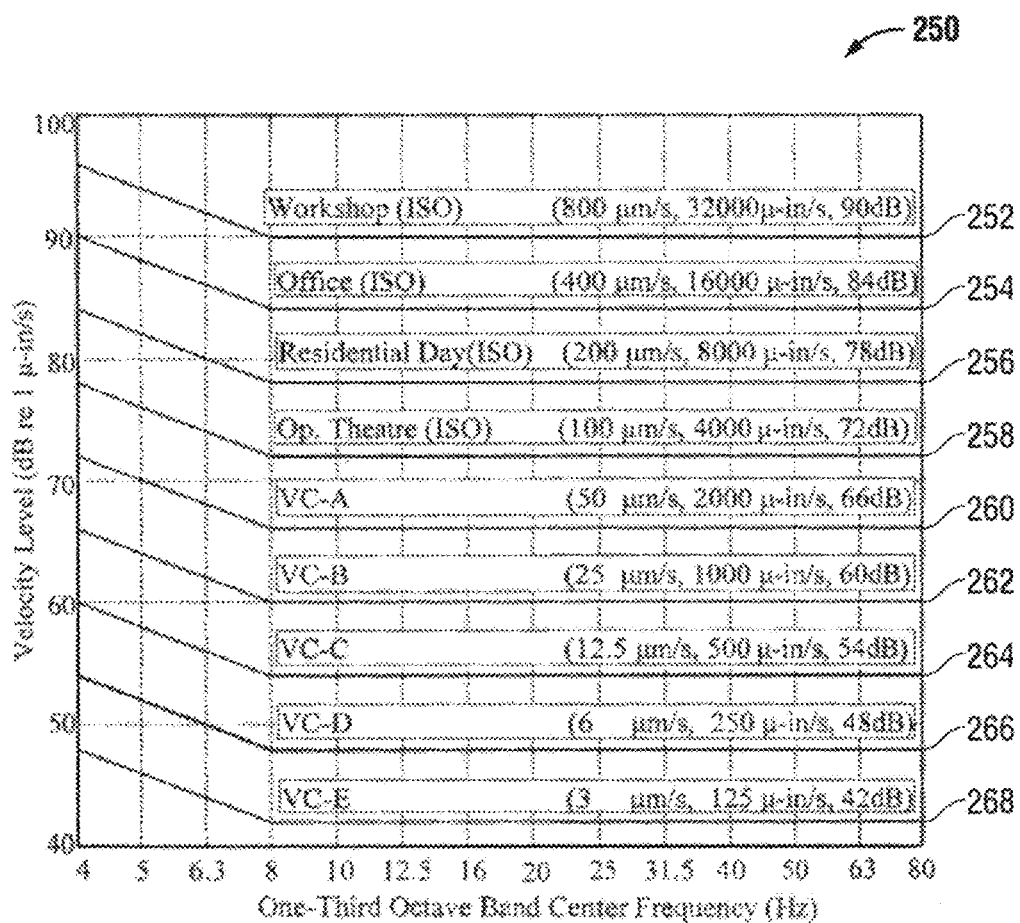
FIG. 16 presents a table plotting vibration velocity levels against one-third octave band frequencies to show various equipment vibration standards for the subject matter of the present disclosure.

To explain the difference, consider FIG. 16, which shows different vibration isolation standards for different environments. FIG. 16 shows plot 250 of Velocity Levels in dB re 1 μ-in/s against One-Third Octave Band Center Frequency (Hz) for various vibration standards. Thus, Workshop (ISO) standard 252 ranging from 8 Hz to 80 Hz at a level of 90 dB re 1 μ-in/s. Other standards include Office (ISO) level 254, Residential Day (ISO) standard 256, Op. Theatre (ISO) 258, and then standards VC-A 260, VC-B 262, VC-C 264, VC-D 266, and VC-E 268. Note that standard VC-E 268 is the most stringent requirement, at 3 μm/s, 123, 125 μ-in/s, and 42 dB.

For most semiconductor fabrication facility applications, such as 14 nm and 10 nm facilities, specifying the VC-D 266 level of vibration isolation is sufficient. However, for production critical tools, industry standards are likely to be at the VC-E 268 is needed. In the future, higher vibration isolation level will be needed. However, at present no fully populated FAB presently meets the VC-E standard. For 7 nm, 5 nm & 3 nm standard, VC-E 268 may be demanded facility-wide or high vibration isolation level will be needed in critical areas, such as lithography process area. Accordingly, the present teachings provide the ability to minimize/reduce or isolate vibration, as much as possible, but with time and cost effectiveness.

On the vibration question, VC-D, 266 provides a satisfactory starting point for the semiconductor processing equipment fabrication vibration regime. Due to small nanometer critical dimension process requirements, the semiconductor industry may soon demand specifying VC-E and greater 268. Unfortunately, no fully populated fabrication facility meets such a requirement. Some manufacturers may even extend their criteria up to 250 Hz, but typically the lower frequencies are more detrimental to fabrication processes. Accordingly, the present disclosure provides a highly practical, valuable, and extraordinarily effective way to satisfy both current and future vibration reduction/elimination requirements.

Transmission of vibration from waffle floor to tool pedestal system in semiconductor FABs depends on several parameters, such as force, frequency, mass, stiffness, energy absorption mechanism, etc. The primary source of vibration of the supporting systems includes the vibration of pumps, compressors, etc. attached below the waffle clean room floor, worker's activities and vibration generated by other machines operating on the waffle floor, and many others. As the industry is evolving toward single digit nanometer FABs, the requirements for limiting vibration are becoming stricter to ascertain reliable and uninterrupted operation. Research and development of efficient vibration isolation mechanisms are also becoming increasingly popular as the traditionally used tool pedestal systems are needing improvement for meeting the vibration tolerance requirements. Certain tool pedestal systems have attached a mass block (often made of concrete) for supporting top-heavy semiconductor fabrication tools. To meet the requirements for vibration isolation, these blocks can be built to have composite masses having metal plates at the bottom and high-strength reinforced concrete block mechanically fastened at the top of the metal plate. The whole composite block can rest on the waffle floor using a thin layer of sound dampening adhesive. The use of the composite mass block in such a hybrid tool pedestal system efficiently acts as a vibration barrier by lowering the frequency content to approximately 140 Hz or lower for an inducing frequency content of up to 240 Hz.

As Semiconductor chip production node size decreases in size, vibration contributes to lower production yield rates in semiconductor chip production. For a major chip manufacturer to build a new FAB for new vibration requirements would cost over one billion dollars per FAB with a separate facility for Ultra Purified Water (UPW) and would take over one year, even with the project being on a "fast track construction". Along with cost effectiveness and vibration reduction/isolation, ease of material handling and installation is needed for cutting Tool Ramp Up and remodel/modernization of FAB to minimize construction down time. As a semiconductor chip node size decreases to single digit nanometer, the list of tool pedestals requiring higher requirements for stiffness, isolation/reduction of vibration are increasing.

Lithography tool pedestals require higher requirements, and Chemical-Mechanical Planarization (CMP) tools and Analysis tool pedestals have increased stiffness and vibration requirements. In addition, as chip node size decreases to single digit nanometer, other support tools such as Etching Tool (Wet or Dry), Chemical Vapor Deposition (CVD) tool, Physical Vapor Deposition (PVD) tool, and new support tools require new specifications for vibration and stiffness.

Support tools generally rely on built in passive vibration reduction systems within the device. Support tool pedestals are made of stainless steel, aluminum, or steel coated with epoxy or powder coated. Some support tool pedestals are mounted on top of existing adjustable height floor pedestal systems, with just steel "I" beams or steel tubing for sublevel support. Size, weight, and MEP penetration access holes have increased, which contributes to loss of tool pedestal stiffness and increase in vibration. Stiffeners, which could be welded around each MEP access penetration opening on the bottom of tool pedestals, increase fabrication time and cost. For some tools, MEP access penetration openings are so large, welded stiffeners are not enough to cope with tool pedestal deflection and vibration. Another way has been using thicker metal for tool pedestals; however, added weight creates material handling issues, increases installation time, and creates the need for upgrading adjustable floor pedestals. Prolonged construction within semiconductor facilities adds to vibration problems and possible production yield loss.

Requirements for semiconductor processing equipment connection details to tool pedestals, recessed or surface mounted are determined per equipment manufacturer. Vibration causes deflection and deflection causes damaging effects to costly high-precision machine tools. The basic idea of the following embodiments includes the suppression of the transmission of vibration from the supporting system to machine tools.

Figure 17:
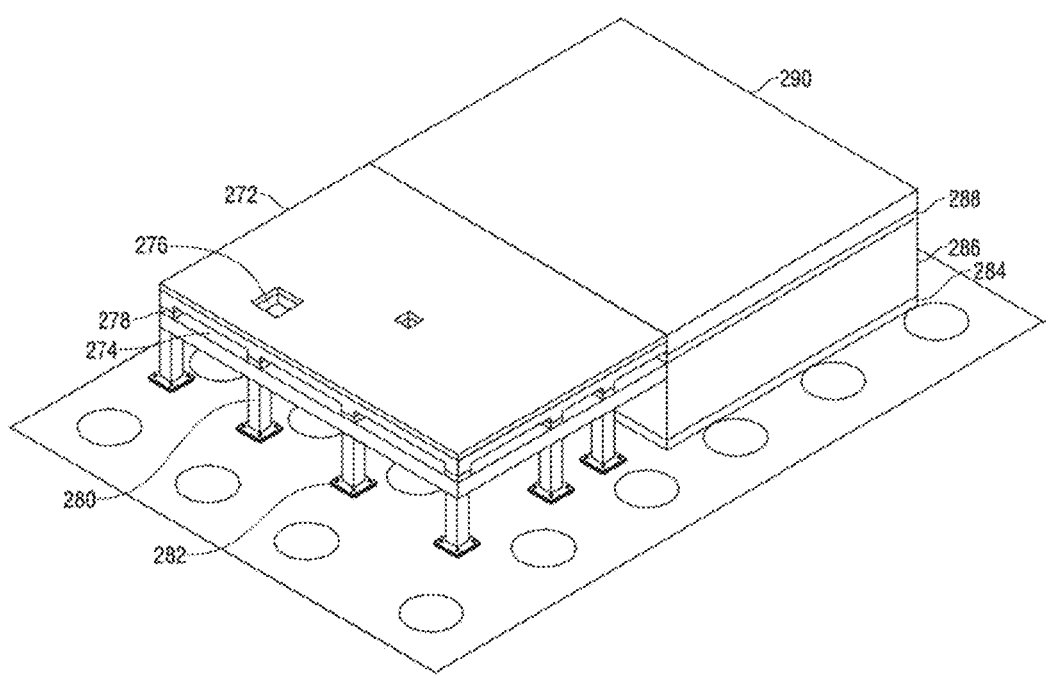
FIG. 17 shows an example of machine tool pedestal supporting system sitting on a waffle clean room floor.

FIG. 17 shows an example of a Hybrid Concrete and Metal Tool Pedestal, machine tool pedestal supporting system sitting on a waffle clean room floor 270. The left part of the system is an assembly of metal pedestals, beams, and plates, in which, structural high-strength porous metal plate 272 is mechanically bonded to solid metal plate 274. All metals may be substituted with other structural metals such as Stainless Steel for tailoring to customer needs. Modern tool pedestal systems often have multiple MEP access openings 276, causing localized reduction in stiffness. The composite floor plate is envisioned to circumvent this stiffness reduction. Below the composite plate, there is perforated porous high-strength metal with vibration dampening adhesive in voided area 278 acting as the barrier in the vibration transmission between the metal pedestals legs 280 and the composite plate 272 and 274. The legs of metal pedestal 280 rest on the waffle floor 270 by using thin layers of solid composite vibration isolation plate and/or vibration dampening material 282 below the base metal plates.

The right part of the system is a composite block of heavy mass which is meant to absorb all frequencies of vibration transmitted from the waffle clean room floor 270. The four components from bottom to top in the heavy mass block are a layer of solid composite vibration isolation plate and/or vibration dampening material 284, a reinforced concrete block 286, another layer of solid composite vibration isolation plate and/or vibration dampening material 288, and a block of porous high strength metal 290. The first layer of solid composite vibration isolation plate and/or vibration dampening material 284 between waffle clean room floor 270 and concrete block 286 will cause immediate reduction in the vibration induced deflection from clean room floor 270 to concrete block 286. The second layer of sound dampening adhesive 288 will further reduce deflection transmitted from concrete block 286 to the porous high strength metal block 290. Overall, the deflection carried from waffle concrete floor 270 to machine tool through these various layers will be significantly low, and thus an effective isolation will be achieved.

Figure 18:
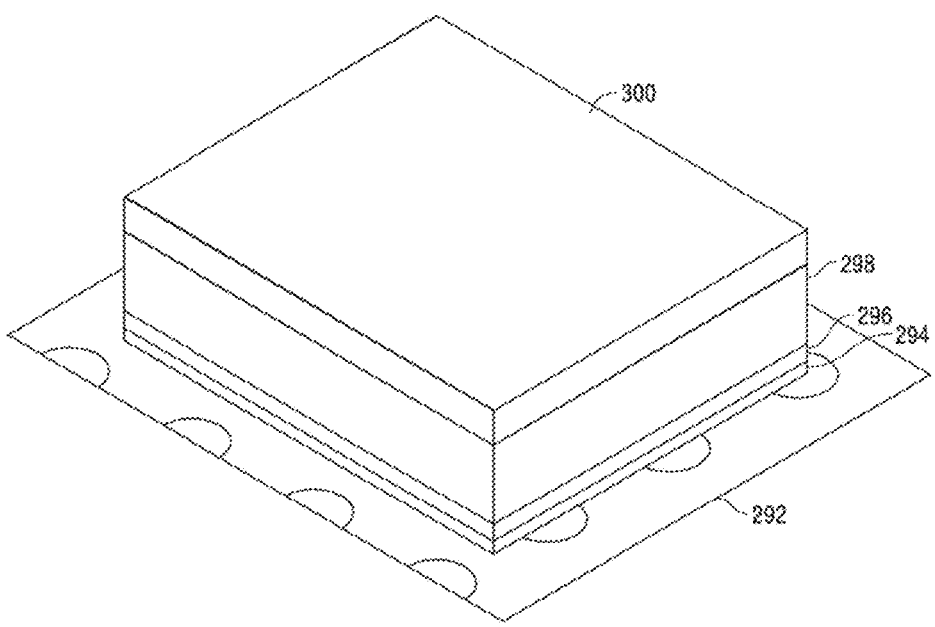
FIG. 18 shows modifications to the example in FIG. 17.

The composite block shown in FIG. 17 needs modification for a top-heavy semiconductor fabrication tool pedestal system. FIG. 18 shows the modifications to FIG. 17. The composite block consists of a thick metal plate 296 and a porous high-strength metal plate 300, mechanically fastened at the bottom and top, respectively, of a high-strength hybrid concrete block 298. The composite block sits on the waffle clean room floor 292 by using one layer of solid composite vibration isolation plate and/or with vibration dampening adhesive 294

Figure 19:
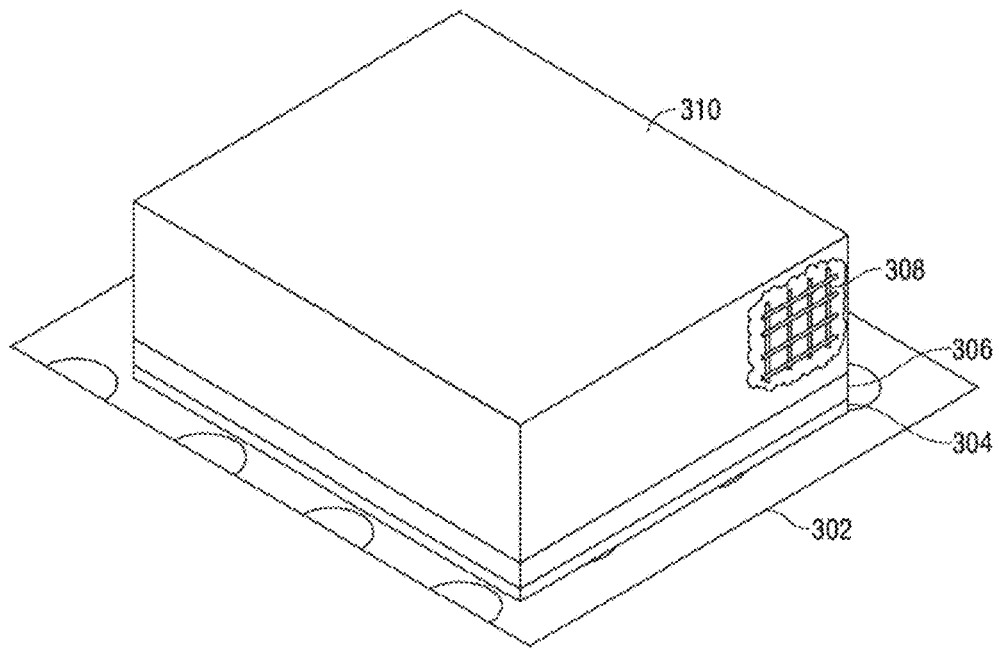
FIG. 19 is another form of composite block for top-heavy semiconductor fabrication tool pedestal systems.
Figure 20:
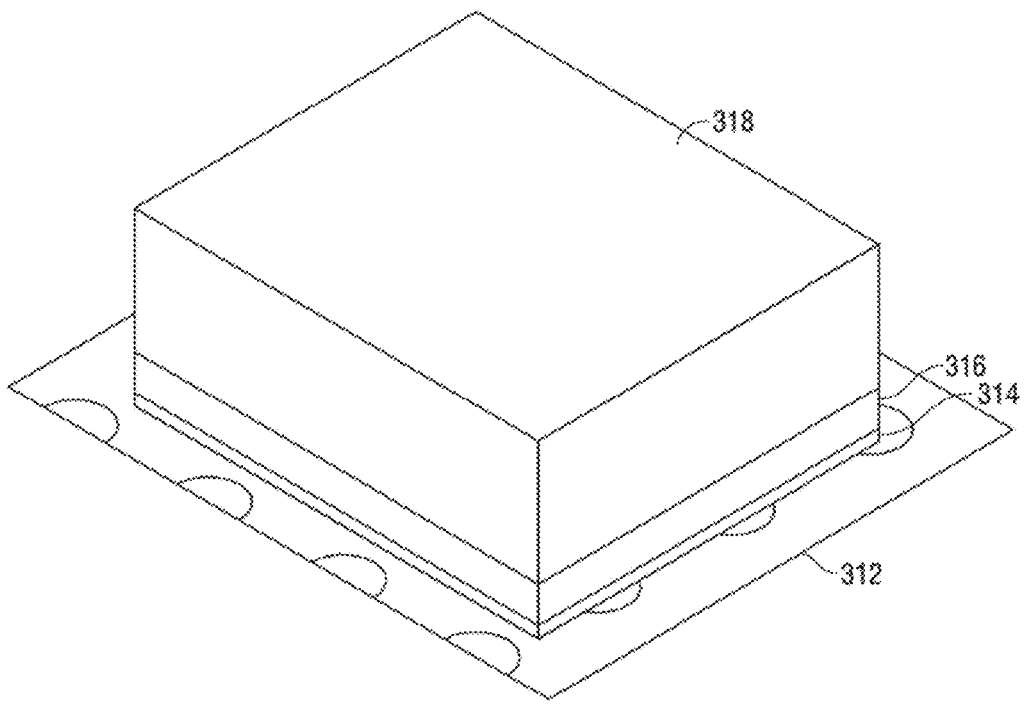
FIG. 20 is another form of composite block for top-heavy semiconductor fabrication tool pedestal systems.

FIG. 19 is another form of composite block for a top-heavy semiconductor fabrication tool pedestal system. The composite block is made of a high-strength reinforced concrete infill 308 with high-strength porous metal cover plates 310 on all sides except the bottom. A stainless steel plate 306 is attached at the bottom to keep the overall weight concentrated close to the waffle clean room floor 302. The composite block rests on the concrete floor using a layer of solid composite vibration isolation plate and/or vibration dampening material 304 FIG. 20 is another form of composite block for a top-heavy semiconductor fabrication tool pedestal system. The composite block in this case consists of a thick metal plate 316 mechanically fastened at the bottom of a high-strength concrete block 318. The composite block sits on the waffle clean room floor 312 by using solid composite vibration isolation plate and/or with vibration dampening adhesive 314.

Figure 21:
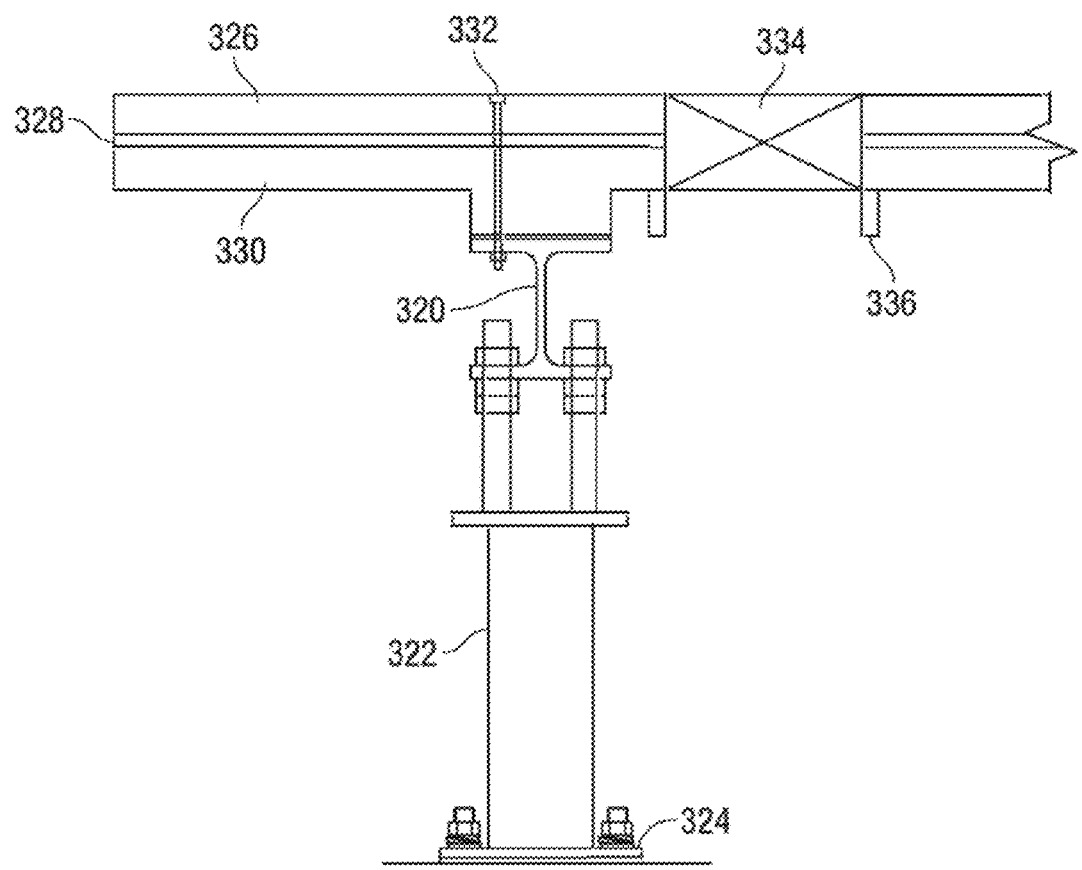
FIG. 21 shows a semiconductor fabrication tool pedestal system to provide a stable structural mechanism.

FIG. 21 shows a type of Hybrid metal semiconductor fabrication tool pedestal system to provide a stable structural mechanism. The bottom part of the pedestal system consists of I-beams 320 and adjustable pedestal bases 322 sitting on a concrete slab by using a layer of solid composite vibration isolation plate and/or with vibration dampening adhesive 324. A sandwich composite metal floor having porous high-strength metal 326 at the top, stainless steel metal pad 330 at the bottom, and a layer of solid composite vibration isolation plate and/or with vibration dampening material 328 in between. The composite floor is fastened to the I-beam by means of mechanical fastening bolts 332. The floor may often have penetration holes 334 for MEP access. Deflection strips 336 are provided around the holes to circumvent the stiffness reduction around the opening.

Figure 22:
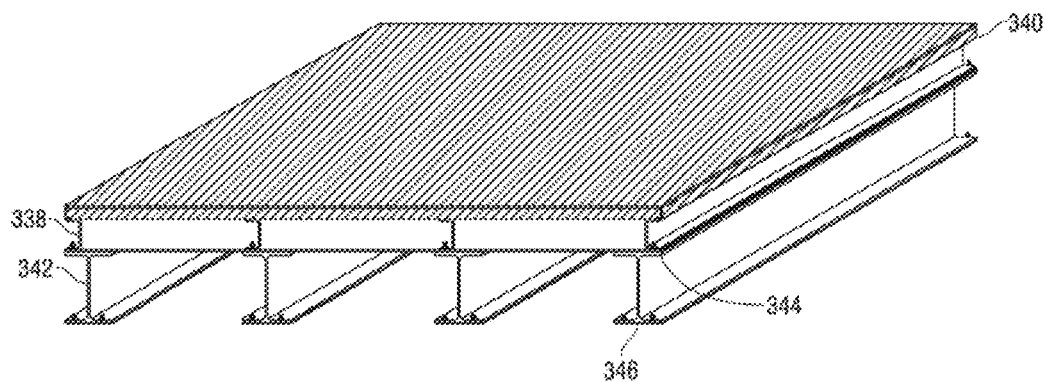
FIG. 22 is an example showing a flooring system having reinforced concrete poured inside metallic channel pan and covered with aluminum plate on top.

FIG. 22 is an example showing a Hybrid concrete and metal tool pedestal system having reinforced concrete 338 poured inside metal channel pans and covered with structural stainless steel or aluminum plate on top 340. The floor system is supported on I-beams 342 used as an alternative tool pedestal base. A layer of vibration dampening material 344 over the flanges and another layer of vibration dampening material 346 below the flanges of the I-beams are used to control the vibration induced deflection. Overall, vibration induced deflections experienced at the top of the floor are expected to be very low as vibration dampening materials will absorb most of vibration energy.

Hybrid Tool Pedestals have multiple layers of metals and may contain particles (type of metal, thickness and density differ for different range of EMI frequencies) combined with concrete, meeting the barrier requirements for EMI below tool pedestals, as well as meeting proper specifications of stiffness, mass, and vibration isolation. Along with EMI barrier requirements, Hybrid Tool Pedestals manufactured using welded/fabricated metal shall also be degaussed to remove magnetic arc blow. Usually there are different welded attachments, reinforcements, and angles of material welded throughout tool pedestals. Ferromagnetic metals can easily develop magnetism, which should be degaussed by using a Yok, Prod, or Degaussing Machine after welding fabrication and prior to incorporating with other materials, essentially making a Hybrid Tool Pedestal system with EMI barrier.

Hybrid tool pedestal system with mixed use of different types and thicknesses of materials, such as HS aluminum, high strength (HS) concrete reinforcing rebar (may include metal particles, EMI insulation or absorbing material added to concrete mix), steel or stainless steel, must follow the degaussing process after fabrication to remove magnetic arc blow to create a hybrid tool pedestal with EMI Barrier. Hybrid tool pedestal with EMI barrier with specified stiffness and vibration isolation with barrier from EMI frequencies from below tool pedestal.

Figure 23:
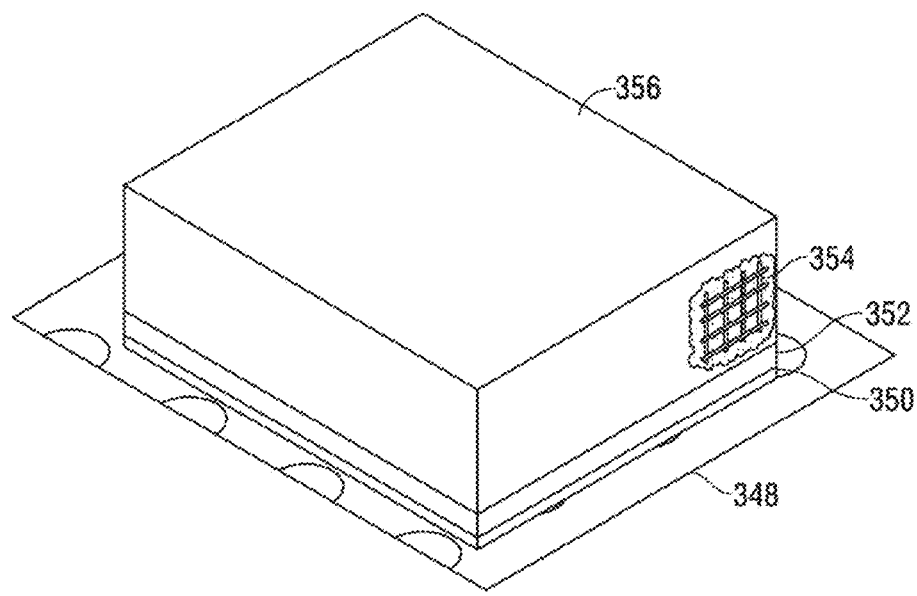
FIG. 23 shows a composite block of HS concrete, which may contain a hybrid mixture to enhance performance with reinforcing rebar over a steel plate and fastened to a semiconductor clean room waffle floor.

FIG. 23 shows composite block 356 of HS concrete with reinforcing rebar, which may include metal particles, EMI insulation or absorbing material, added to concrete mix 354 over steel plate 352 and mechanically or chemically fastened to semiconductor clean room waffle floor 348 using vibration dampening material 350.

Figure 24:
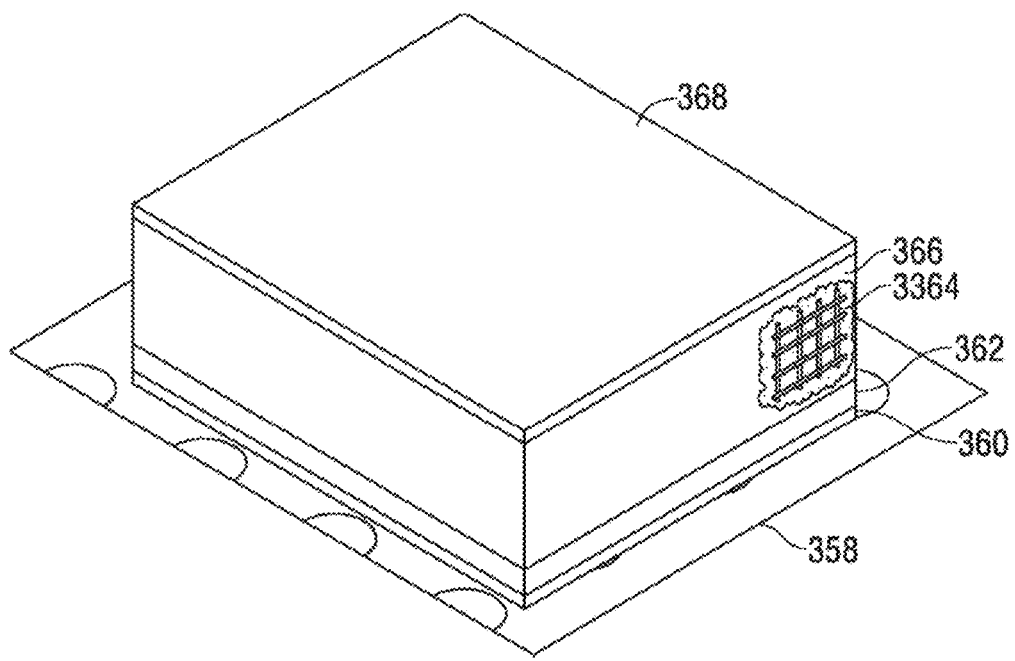
FIG. 24 shows high structural grade aluminum, or may be substituted with another type of metal per clients' special needs on top of the composite block over steel plate and fastened to a semiconductor clean room waffle clean room floor.

FIG. 24 presents HS aluminum 368 on top of composite block 366 formed of HS concrete with reinforcing rebar, which may include metal particles, EMI insulation or absorbing material, added to concrete mix 364 over steel plate 362 and mechanically or chemically fastened to semiconductor clean room waffle floor 358 using vibration dampening material 360.

Figure 25:
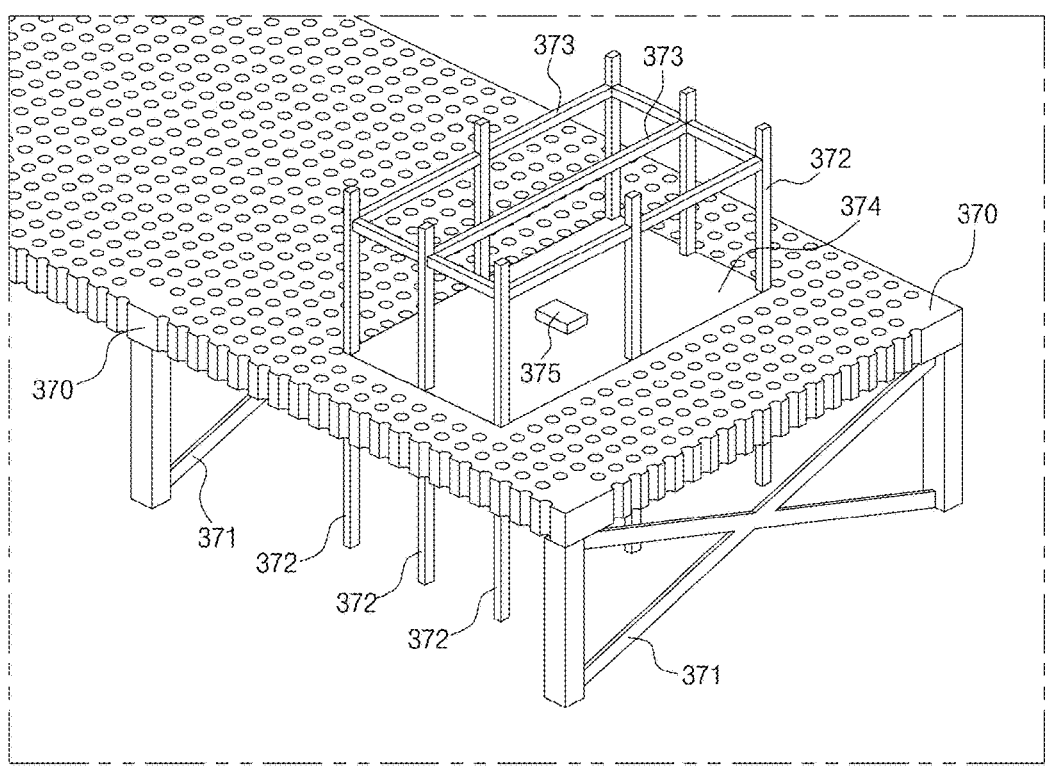
FIG. 25 shows an extended tool pedestal, which supports from the Sub Process level extended to the level above the Process level, and optional building structure for improving building stiffness.

FIG. 25 is a cut away view of a partial semiconductor process level and sub-level. A concrete structure 370 exists with waffle floor. An optional steel member 371 is fabricated to "X" style bracing (vertical and horizontal or combination of bracing) for improving structural stiffness. A structural support 372 can be made with concrete or steel from floor to ceiling of process level and beyond as needed. A horizontal structural member 373 in the future may serve as service crane for the tool or for other services. A 2" (50.8 mm) stainless steel 374 can also be replaced with hybrid concrete mix with or without different type of metals or hybrid mix of metals with various thicknesses to reduce/isolate vibration from the building structure. A tool 375 is placed on the extended hybrid tool pedestal platform.

As part of the hybrid tool pedestal system, Extended hybrid tool pedestals extend from floor to ceiling to meet higher vibration tolerance level, advance lithograph tools and or newer ISO building vibration specifications. The extended hybrid tool pedestal may consist of optional bracing ("X", vertical & horizontal or combination of bracing) for the facility structure to reduce vibration. The extended hybrid tool pedestal design may start from the floor to ceiling, from sub levels to the upper level of process level, or as needed to reduce structural vibration. Within the support structure of the extended hybrid tool pedestal, structural members may also serve as future platform for additional items such as automated material handling system (AMHS) attachments, service crane, etc. Structural members of the extended hybrid tool pedestal may range from single level to multi-levels, per semiconductor facilities and per vibration requirements as needed.

In summary, the present disclosure provides a method, system, and semiconductor fabrication facility that eliminates, or substantially reduces, process-limiting vibrations within a high-precision device manufacturing facility, wherein an elevated structure supports high-precision device manufacturing equipment and provides vibration reduction spacing between a floor and an upper surface of said elevated structure. The method comprises the steps of separating a base of the elevated structure from the floor using a first vibration isolation pad structure. Vibration dampening materials fill a hollow portion of a vertical support structure, separating the base from said upper surface. A second vibration isolation pad structure separates the vertical support structure from the upper structure of the elevated structure. In the present disclosure, the first vibration isolation pad structure, the vibration dampening material, and the second isolation pad structure coordinate to eliminate, or substantially reduce, the ability of vibrations from the floor to reach high-precision device manufacturing equipment operating on the upper surface of said elevated structure. The structure may further include EMI insulation or absorbing material added to concrete mix, steel, or stainless steel, as well as undergo a degaussing process after fabrication to remove magnetic arc blow to create a hybrid tool pedestal with EMI Barrier.

Technical advantages of the present disclosure include providing a hybrid system for eliminating/substantially reducing both high and low frequency vibrations. High frequency vibrations may be considered, for example, Workshop (ISO), Office (ISO), Residential Day (ISO), and Operating Theatre (ISO) ranges of vibration, as defined here by the chart of FIG. 16. Low frequency vibrations may be considered those vibrations classified as VC-C, VC-D, and VC-E in FIG. 16. The teachings of the present disclosure provide the ability to establish an environment operating in the range of VC-E.

The disclosed method and system include the use of dedicated MEP (mechanical, electrical, plumbing) support pedestals, as the only attachment support for MEP lines, as to improve isolation of low frequency vibrations. With minimal weight increase for material for ease of material handling and installation, this method is intended for tools without specifically designed vibration frequency dampening and isolation tool pedestals and pads; which only relied on it's built in passive vibration isolation systems. Reduction and isolation of vibration frequencies for improving production yields as semiconductor chip design is advancing in smaller nanometer critical dimensions for semiconductor device processing.

The disclosed vibration isolation structures, in addition to industry standard structures, such as construction isolation joints and miniature tile dampening pads between raised floor tiles to pedestal, and vibration isolation connectors for MEP lines. Moreover, the improved isolation of vibration frequencies transmitted through building structure to achieve better production yield rates.

The method and system of the present disclosure are economical, schedule driven, and impose minimal weight in the construction of material handling and installation facilities for nanometer-scale semiconductor fabrication facilities and similar high precision lithography and fabrication environments. As a result of the present teachings, semiconductor fabrication yields and process efficiencies greatly improve.

The present method and system may eliminate, or substantially reduce, low frequency vibrations which affect production tools such as lithograph tools, so as to increase lithographic accuracy and yield percentages in semiconductor device fabrication. Accordingly, the effects from vibration sources, such as foot traffic over raised floor systems, pumps, compressors, chillers, and AHUs (air handling units) that produce low frequency vibrations transmitted through building and clean room floor structures, are eliminated or substantially reduced.

The present disclosure includes the ability to allow newer semiconductor production tools having tighter vibration frequency requirements to operate effectively in conjunction with older support tools with outdated vibration specifications. The ability to extend the useful life of older equipment may result in process expense reductions and greater operational profits for semiconductor device fabrication facilities. The disclosed design permits vibration isolation without having to modify entire structures, as well as with minimal overall weight variations as a result of vibration isolation modifications.

The present disclosure permits installation of composite vibration dampening material within structural components rapidly and with minimal disruption in fabrication facility operations. As a result, the significant improvements of the present subject matter afford major operational and efficiency improvements with a most economical set of structural transformations to increase overall fabrication facility profitability and efficiency. The disclosed subject matter avoids the enormous expense of replacing all old support tools with new ones having vibration specification matching new key production tools.

The detailed description set forth herein in connection with the appended drawings is intended as a description of exemplary embodiments in which the presently disclosed subject matter may be practiced. The term "exemplary" used throughout this description means "serving as an example, instance, or illustration," and should not necessarily be construed as preferred or advantageous over other embodiments.

This detailed description of illustrative embodiments includes specific details for providing a thorough understanding of the presently disclosed subject matter. However, it will be apparent to those skilled in the art that the presently disclosed subject matter may be practiced without these specific details. In some instances, well-known structures and devices are shown in block diagram form in order to avoid obscuring the concepts of the presently disclosed method and system.

The foregoing description of embodiments is provided to enable any person skilled in the art to make and use the subject matter. Various modifications to these embodiments will be readily apparent to those skilled in the art, and the novel principles and subject matter disclosed herein may be applied to other embodiments without the use of the innovative faculty. The claimed subject matter set forth in the claims is not intended to be limited to the embodiments shown herein, but is to be accorded the widest scope consistent with the principles and novel features disclosed herein. It is contemplated that additional embodiments are within the spirit and true scope of the disclosed subject matter.

What is claimed is:

1. A method for eliminating, or substantially reducing, process-limiting vibrations within a high-precision device manufacturing facility, comprising:
   using a hybrid tool pedestal system for supporting high-precision device manufacturing equipment and provides vibration reduction spacing between a floor and an upper surface of an elevated structure, the method comprising of the following steps:
   separating a base of said elevated structure from the floor using first vibration isolation pad structure;
   filling a hollow portion of a vertical support structure with a vibration dampening materials, said vertical support structure separating said base from said upper surface and further comprising concrete mix to reduce/isolate vibration and improve stiffness;
   separating said vertical support structure from the upper surface of said elevated structure using a second vibration isolation pad structure;
   wherein said first vibration isolation pad structure, said vibration dampening materials, and said second vibration isolation pad structure coordinate to eliminate, or substantially reduce, the ability of vibrations from the floor to reach high-precision device manufacturing equipment operating on the upper surface of said elevated structure; and
   adding an EMI insulation or absorbing material added to said vertical support structure and
   performing a degaussing process on said vertical support structure for removing magnetic arc blow to create said hybrid tool pedestal with EMI barrier;
   caulking a solid composite vibration isolation plate between a plurality of points of connections between said solid composite vibration isolation plate and said tool pedestal pad, and a raised floor system providing a floor upon which rests said hybrid tool pedestal system;
   applying a sound proofing adhesive to selected joints associated with said vertical support structure; and
   caulking said solid composite vibration isolation plate between the points of contact and the vertical support structure for further isolation of vibration frequencies transmitted through a building structure within which occurs said method for eliminating, or substantially reducing, process-limiting vibrations.

2. The method of claim 1, further comprising the steps of epoxy coating or powder coating with negative ion properties said vertical support structure for structural strength.

3. The method of claim 1, further comprising the step of isolating vibrations associated with MEP lines using a plurality of vibration dampened connectors to improve isolation of vibrations frequency transmitted MEP lines and through the building structure.

4. A vibration isolation and reducing system for eliminating or substantially reducing process-limiting vibrations within a high-precision device manufacturing facility, comprising:
   a hybrid tool pedestal system for supports high-precision device manufacturing equipment and provides vibration reduction spacing between a floor and an upper surface of said an elevated structure, the hybrid tool pedestal system comprising:

first vibration isolation pad structure for separating a base of said elevated structure from the floor;

a vibration dampening material for filling a hollow portion of a vertical support structure, said vertical support structure separating said base from said upper surface and further comprising of additional materials to be added into a concrete mix to improve/reduce/isolate vibration and improve stiffness;

a second vibration isolation pad structure for separating said vertical support structure from the upper structure of said elevated structure;

wherein said first vibration isolation pad structure, said vibration dampening material, and said second vibration isolation pad structure coordinate to eliminate, or substantially reduce, the ability of vibrations from the floor to reach high-precision device manufacturing equipment operating on the upper surface of said elevated structure; and further an EMI barrier applied to the hybrid tool pedestal system formed by adding EMI insulation or absorbing material and performing a degaussing step on said hybrid tool pedestal for removing magnetic arc blow relating to use of said hybrid tool pedestal system; and an structural bracing of "X" style, wherein the system extends from said floor to a ceiling of existing or outdated buildings to stiffen the existing building and to meet newer tool vibration requirements such as advance lithograph tools, where the optional structural bracing of "X" style works in conjunction with an extended hybrid tool pedestal, wherein a base of the extended hybrid tool pedestal extends from the floor of a sub process level to above a process level to meet extended vibration requirements, wherein along with the extended hybrid tool pedestal, additional horizontal structural members are added for future service of tooling, such as a service crane for semiconductor production process tools, and wherein the base of the extended hybrid tool pedestal varies due to different multiple levels per each semiconductor facility.

5. The system of claim 4, wherein said vertical support structure is epoxy coated or powder coated with negative ion properties for structural strength.

6. The system of claim 4, further comprising a plurality of vibration dampened connectors for isolating vibrations associated with MEP lines using to improve isolation of vibration frequency transmitted, MEP lines and through a building structure within which said vibration isolation and reducing system operates.

7. The system of claim 4, wherein at least one of the first and second vibration isolation pad structures has an said opening filled with a vibration dampening material.

8. A high-precision device manufacturing facility having eliminated, or substantially reduced, process-limiting vibrations there within, comprising:

a plurality of hybrid tool pedestal structures for supporting high-precision device manufacturing equipment and providing vibration reduction spacing between a floor and an upper surface of an elevated structure, selected ones of said plurality elevated structures further comprising:

first vibration isolation pad structure for separating a base of said elevated structure from the floor;

a vibration dampening material for filling a hollow portion of a vertical support structure, said vertical support structure separating said base from said upper surface;

a second vibration isolation pad structure for separating said vertical support structure from the upper surface of said elevated structure;

wherein said first vibration isolation pad structure, said vibration dampening material, and said second vibration isolation pad structure coordinate to eliminate, or substantially reduce, the ability of vibrations from the floor to reach high-precision device manufacturing equipment operating on the upper surface of said elevated structure; and further an EMI barrier applied to said plurality of hybrid tool pedestal structures formed by adding EMI insulation or absorbing material and performing a degaussing step on said hybrid tool pedestal for removing magnetic arc blow relating to use of said hybrid tool pedestal; and said vibration dampening material placed between the point of connections for tool pedestal/pad and a raised floor system upon which rests said hybrid tool pedestal system; said vibration dampening material applied to selected joints associated with said vertical support structure; and said vibration dampening material placed at points of contact between the vertical support structure for further isolation of vibration frequencies transmitted through a building structure within which said high-precision device manufacturing facility operates.

9. The high-precision device manufacturing facility of claim 8, further comprising the step of associating said first vibration isolation pad structure, said vibration dampening material, and said second vibration isolation pad structure for eliminating/substantially reducing both high frequency vibrations ranging from approximately 100 µm/s to approximately 800 µm/s and low frequency vibrations ranging from approximately 3 µm/s to approximately 50 µm/s.

10. The high-precision device manufacturing facility of claim 8, further comprising of said first vibration isolation pad structure, said vibration dampening material, and said second vibration isolation pad structure installed without substantially modifying the overall mechanical configuration of said elevated structure.

11. The high-precision device manufacturing facility of claim 8, wherein the plurality of hybrid tool pedestal structures have a multiple-stacked structure with "X" column bracing to stiffen the building structure within which said high-precision device manufacturing facility operates to work with an extended hybrid tool pedestal which extends from the building ground level to an upper deck of a ceiling of the building structure for additional improvement of vibration isolation.

\* \* \* \* \*